US012633900B2

(12) United States Patent
Wang

(10) Patent No.: US 12,633,900 B2
(45) **Date of Patent: \*May 19, 2026**

(54) FILM BULK ACOUSTIC RESONATOR STRUCTURE AND FABRICATING METHOD

(71) Applicant: Shenzhen Newsonic Technologies Co., Ltd., Shenzhen (CN)

(72) Inventor: Jian Wang, Shenzhen (CN)

(73) Assignee: Shenzhen Newsonic Technologies Co., Ltd., Shenzhen (CN)

( \* ) Notice: Subject to any disclaimer, the term of this patent is extended or adjusted under 35 U.S.C. 154(b) by 521 days.

This patent is subject to a terminal disclaimer.

(21) Appl. No.: 17/504,747

(22) Filed: Oct. 19, 2021

(65) Prior Publication Data

US 2022/0103158 A1     Mar. 31, 2022

(51) Int. Cl.
| | |
|---|---|
| *H03H 3/02* | (2006.01) |
| *H03H 9/02* | (2006.01) |
| *H03H 9/13* | (2006.01) |
| *H03H 9/17* | (2006.01) |

(52) U.S. Cl.
CPC .............. *H03H 9/173* (2013.01); *H03H 3/02* (2013.01); *H03H 9/02015* (2013.01); *H03H 9/131* (2013.01)

(58) Field of Classification Search
CPC ...... H03H 9/173; H03H 3/02; H03H 9/02015; H03H 9/131
See application file for complete search history.

(56) References Cited

U.S. PATENT DOCUMENTS

| | | | | |
|---|---|---|---|---|
| 9,634,641 | B2 * | 4/2017 | Nishimura | ........... H03H 9/0576 |
| 10,574,209 | B2 * | 2/2020 | Guo | ........................ H01L 23/10 |
| 10,630,259 | B2 * | 4/2020 | Hurwitz | .............. H10N 30/877 |
| 2017/0366153 | A1 | 12/2017 | Adkisson | |
| 2018/0226947 | A1 | 8/2018 | Baek | |
| 2019/0245509 | A1 | 8/2019 | Hurwitz | |
| 2020/0091888 | A1 * | 3/2020 | Lee | ........................ H03H 9/174 |
| 2020/0169246 | A1 * | 5/2020 | Kim | ................... H03H 9/02118 |
| 2020/0313751 | A1 * | 10/2020 | Shealy | .................... H03F 3/195 |
| 2021/0218381 | A1 | 7/2021 | Luo | |
| 2021/0226600 | A1 * | 7/2021 | Yang | .................... H10N 30/708 |

FOREIGN PATENT DOCUMENTS

| | | |
|---|---|---|
| CN | 101465628 A | 6/2009 |
| CN | 105762085 A | 7/2016 |
| CN | 107623502 A | 1/2018 |
| CN | 108023560 A | 5/2018 |
| CN | 109286385 A | 1/2019 |

(Continued)

*Primary Examiner* — Abdallah Abulaban

(74) *Attorney, Agent, or Firm* — Finnegan, Henderson, Farabow, Garrett & Dunner LLP.

(57) ABSTRACT

A film bulk acoustic resonator (FBAR) structure includes a bottom cap wafer, a piezoelectric layer disposed on the bottom cap wafer, a bottom electrode disposed below the piezoelectric layer, and a top electrode disposed above the piezoelectric layer. Portions of the bottom electrode, the piezoelectric layer, and the top electrode that overlap with each other constitute a piezoelectric stack. The FBAR structure further includes a lower cavity disposed below the piezoelectric stack. A projection of the piezoelectric stack is located within the lower cavity.

18 Claims, 33 Drawing Sheets

1300

(56)     References Cited

FOREIGN PATENT DOCUMENTS

| | | | |
|---|---|---|---|
| CN | 109995341 | A | 7/2019 |
| CN | 110504936 | A | 11/2019 |
| CN | 209897019 | U | 1/2020 |
| CN | 111010114 | A | 4/2020 |
| CN | 111130483 | A | 5/2020 |
| CN | 111294007 | A | 6/2020 |
| CN | 112039455 | A | 12/2020 |
| CN | 112039471 | A | 12/2020 |
| CN | 112117986 | A | 12/2020 |
| CN | 112117987 | A | 12/2020 |
| CN | 112311353 | A | 2/2021 |
| CN | 112468107 | A | 3/2021 |
| CN | 213846626 | U | 7/2021 |
| JP | 2008131356 | A | 6/2008 |
| TW | 201817161 | A | 5/2018 |

* cited by examiner

1100

281
441
260
420
232 { 232
230
120
130
180
190
350
1000

282
260
442 } 222
250
430
240
220
140
150
160
170
200
350
210
1000

400
145
500b
500a
410

1100

282
260
442
250    } 222
430
240
220
140
150
160
170
200
350
210

281
441
260
420    } 232
230
120
130
180
190
350

400

500b

500a

410

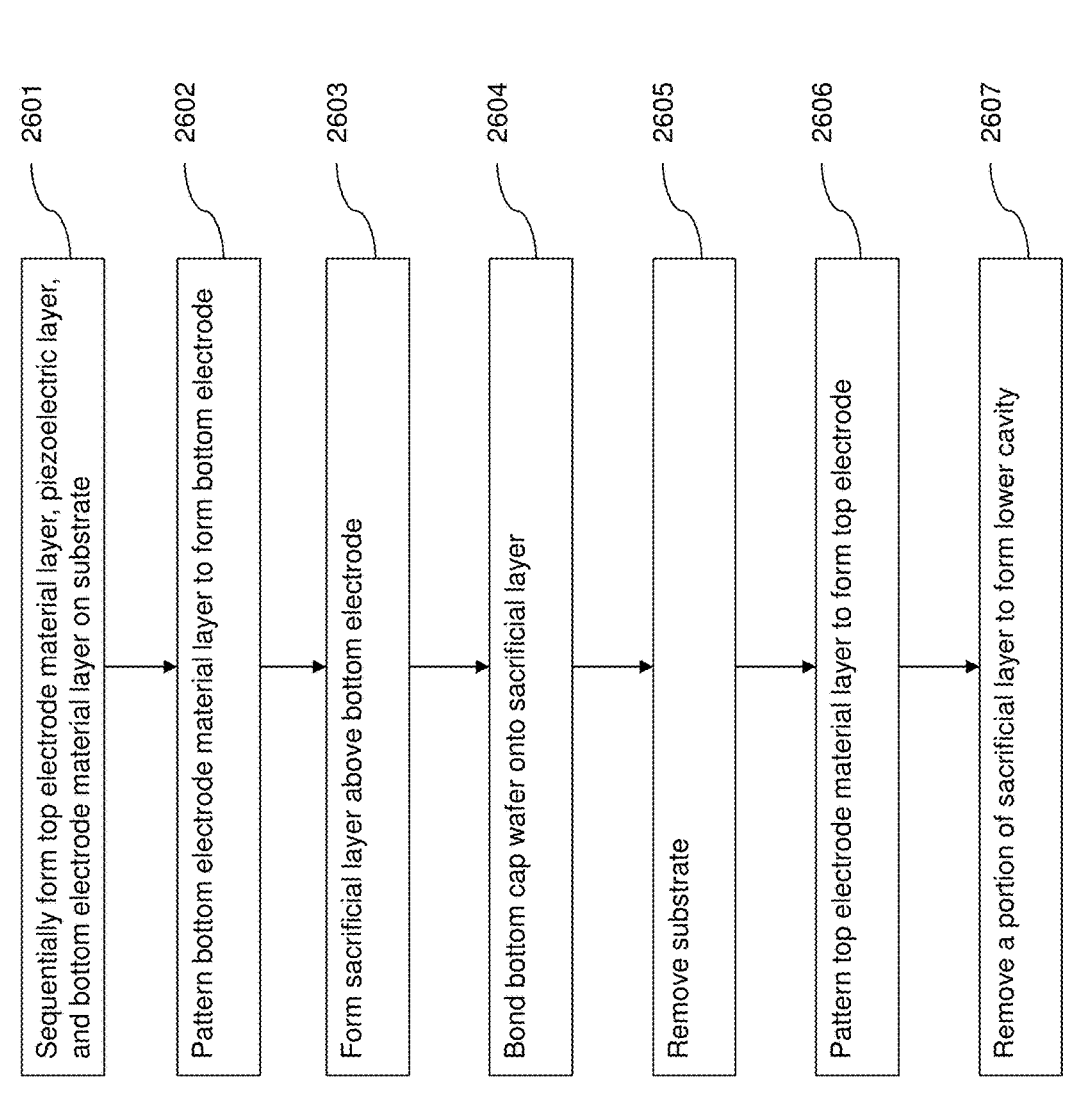

2601

Sequentially form top electrode material layer, piezoelectric layer, and bottom electrode material layer on substrate

2602

Pattern bottom electrode material layer to form bottom electrode

2603

Form sacrificial layer above bottom electrode

2604

Bond bottom cap wafer onto sacrificial layer

2605

Remove substrate

2606

Pattern top electrode material layer to form top electrode

2607

Remove a portion of sacrificial layer to form lower cavity

FILM BULK ACOUSTIC RESONATOR STRUCTURE AND FABRICATING METHOD

FIELD OF THE DISCLOSURE

The present disclosure relates to the field of semiconductor devices and, in particular, to a film bulk acoustic resonator (FBAR) structure and a method of fabricating the FBAR structure.

BACKGROUND

A film bulk acoustic resonator (FBAR) is a device including a thin film that is made of a piezoelectric material and disposed between two electrodes. The FBAR is a type of bulk acoustic wave (BAW) resonator. The FBAR device is typically fabricated using semiconductor micro-processing technology.

Due to its small thickness, the FBAR device may be used in applications requiring high frequency, small size, and light weight. An exemplary application of the FBAR device is a filter used in mobile communication devices.

SUMMARY

According to one embodiment of the disclosure, a film bulk acoustic resonator (FBAR) structure is provided. The FBAR structure includes a bottom cap wafer, a piezoelectric layer disposed on the bottom cap wafer, a bottom electrode disposed below the piezoelectric layer, and a top electrode disposed above the piezoelectric layer. Portions of the bottom electrode, the piezoelectric layer, and the top electrode that overlap with each other constitute a piezoelectric stack. The FBAR structure further includes a lower cavity disposed below the piezoelectric stack. A projection of the piezoelectric stack is located within the lower cavity.

According to one embodiment of the disclosure, a method for fabricating a FBAR structure is provided. The method includes: sequentially forming a top electrode material layer, a piezoelectric layer, and a bottom electrode material layer on a substrate; patterning the bottom electrode material layer to form a bottom electrode; forming a sacrificial layer above the bottom electrode; bonding a bottom cap wafer onto the sacrificial layer; removing the substrate; patterning the top electrode material layer to form a top electrode; and removing a portion of the sacrificial layer to form a lower cavity.

BRIEF DESCRIPTION OF THE DRAWINGS

The accompanying drawings, which are incorporated in and constitute a part of this application, illustrate disclosed embodiments and, together with the description, serve to explain the disclosed embodiments.

FIG. 26 is a flow chart of a method of fabricating a FBAR structure, according to an embodiment of the present disclosure.

DETAILED DESCRIPTION

Figure 1A:
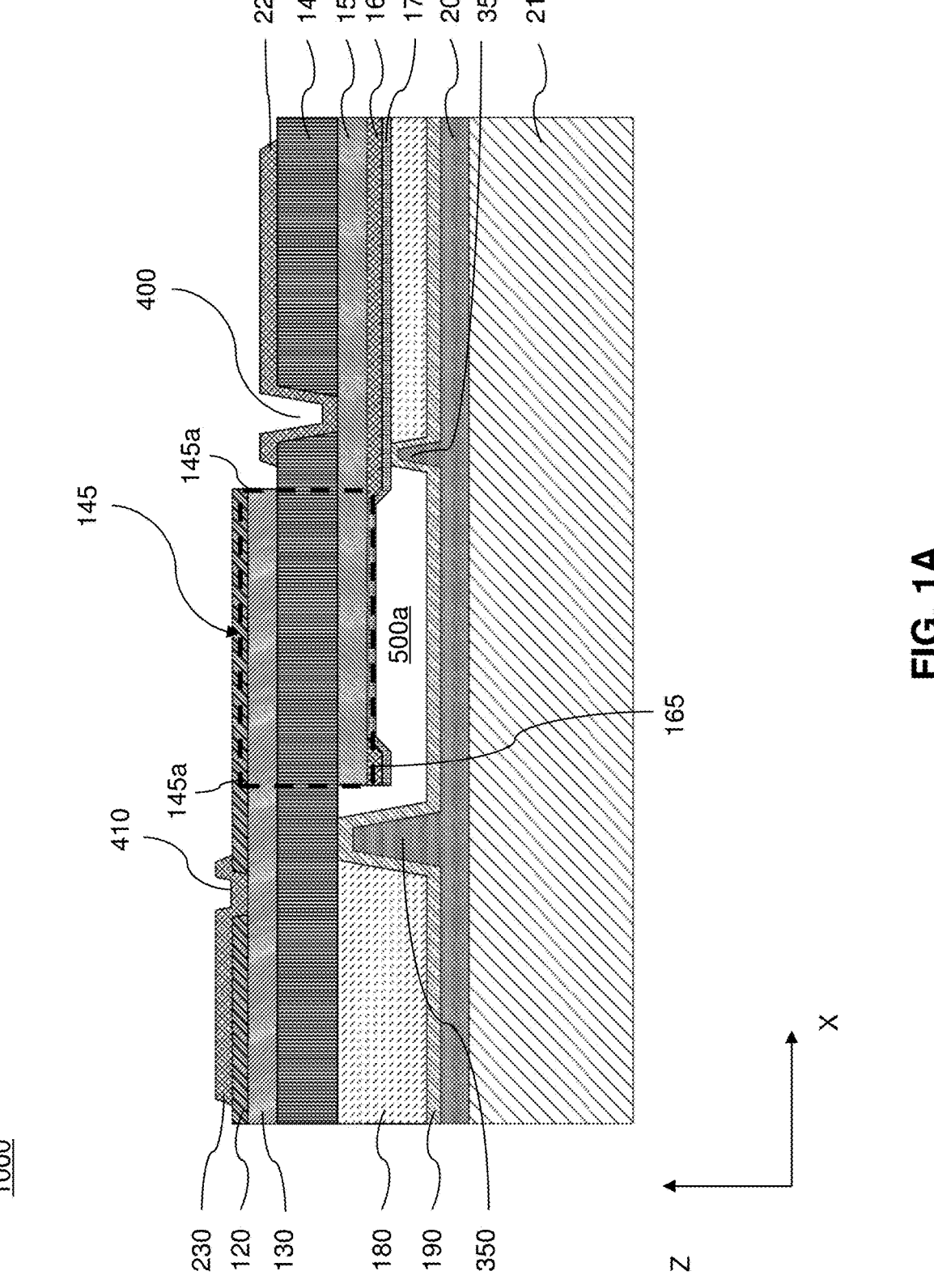
FIG. 1A is a cross-sectional view of a FBAR structure, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "front," "back," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

FIG. 1A is a cross-sectional view of a film bulk acoustic resonator (FBAR) structure 1000, according to an embodiment of the present disclosure. As illustrated in FIG. 1A, FBAR structure 1000 includes a bottom cap wafer 210, a piezoelectric layer 140 disposed on bottom cap wafer 210, a bottom electrode 150 disposed below piezoelectric layer 140, and a top electrode 130 disposed above piezoelectric layer 140. Portions of bottom electrode 150, piezoelectric layer 140, and top electrode 130 that overlap with each other constitute a piezoelectric stack 145. FBAR structure 1000 also includes a lower cavity 500a disposed below piezoelectric stack 145. A projection of the piezoelectric stack 145 along a stacking direction of piezoelectric stack 145 (Z-axis direction in FIG. 1A) is located within lower cavity 500a. In other words, in a top view of FBAR structure 1000 (viewing along the Z-axis direction), edges 145a of piezoelectric stack 145 are located inside lower cavity 500a. In the present embodiment, both of top electrode 130 and bottom electrode 150 are formed through precise pattern etching to obtain required structures. As a result, the vertical overlap of top and bottom electrodes 130 and 150 in a non-effective resonator function area (i.e., an area outside of lower cavity 500*a*) is minimized, and thus the parasitic capacitance is minimized.

Bottom cap wafer 210 may include a material such as, for example, silicon (Si), silicon carbon (SiC), aluminum oxide, quartz, glass (SiO₂), or sapphire (Al₂O₃). In the present embodiment, bottom cap wafer 210 includes silicon.

Piezoelectric layer 140 may include a material with piezoelectric properties such as, for example, aluminum nitride (AlN), zinc oxide (ZnO), lithium niobate (LiNbO₃), lithium tantalate (LiTaO₃), lead zirconate titanate (PZT), barium strontium titanate (BST), etc., or a stacked combination of two or more of these materials. When the material of piezoelectric layer 140 is aluminum nitride (AlN), the aluminum nitride may be doped with a certain proportion of rare earth elements, for example, scandium, erbium, lanthanum, etc. In the present embodiment, the material of piezoelectric layer 140 is aluminum nitride (AlN) or scandium doped aluminum nitride (ScAlN).

Top and bottom electrodes 130 and 150 may include any suitable conductive material, including various metal materials with conductive properties such as molybdenum (Mo), aluminum (Al), copper (Cu), platinum (Pt), tantalum (Ta), tungsten (W), palladium (Pd), ruthenium (Ru), etc., or a stacked combination of two or more of these conductive metal materials. In the present embodiment, top and bottom electrodes 130 and 150 include molybdenum (Mo).

As illustrated in FIG. 1A, a frame layer 160 is disposed on at least a portion of a lower surface of bottom electrode 150. Frame layer 160 is used to form a raised structure 165 along an edge of a resonator electrode (i.e., bottom electrode 150 in the present embodiment). Raised structure 165 protrudes towards lower cavity 500*a*. Frame layer 160 may include a conductive material, which may be the same as the material of bottom electrode 150 or may be different from the material of bottom electrode 150. Additionally or alternatively, in an embodiment, frame layer 160 may be disposed on at least a portion of a top surface of top electrode 130, to form a raised structure along an edge of top electrode 130. The raised structure protrudes from top electrode 130 in a direction away from bottom electrode 150.

A top passivation layer 120 is disposed above, and covers a top surface of, top electrode 130. A bottom passivation layer 170 is disposed below, and covers bottom surfaces of, bottom electrode 150 and frame layer 160. Top passivation layer 120 may include aluminum nitride (AlN). Bottom passivation layer 170 may include a material such as silicon nitride (SiN), aluminum nitride (AlN), silicon oxide (SiO2), silicon oxynitride (SiNO), etc., or a stacked combination of two or more of these materials.

A sacrificial layer 180 is disposed below bottom passivation layer 170 and a portion of piezoelectric layer 140. Sacrificial layer 180 may include silicon oxide.

A trench 350 is formed on sacrificial layer 180. A boundary layer 190 (also referred-to as a "stop layer") is disposed on sacrificial layer 180 and on sidewalls and bottom of trench 350. Boundary layer 190 may include non-conductive materials such as silicon (Si), silicon nitride (SiN), aluminum nitride (AlN), or a stacked combination of two or more of these materials.

Inside trench 350, boundary layer 190 is in contact with a lower surface of piezoelectric layer 140 and a lower surface of bottom passivation layer 170. In the top view of FBAR structure 1000, trench 350 has a closed ring shape, and boundary layer 190 disposed therein also forms a closed ring shape. Lower cavity 500*a* is obtained by removing (e.g., etching) a portion of sacrificial layer 180. A boundary of the removal of sacrificial layer 180 is defined by boundary layer 190 disposed in trench 350. In other words, lower cavity 500*a* is surrounded by boundary layer 190 disposed in trench 350.

A bottom bonding layer 200 is disposed below boundary layer 190, and bonded to bottom cap wafer 210. Bottom bonding layer 200 may include silicon oxide, silicon nitride, etc., or a stacked combination of these materials. In the present embodiment, bottom bonding layer 200 includes silicon oxide.

Top passivation layer 120 is provided with a top electrode contact window 410 that exposes a portion of top electrode 130. A top electrode contact layer 230 is disposed above top passivation layer 120 and is electrically connected to top electrode 130 via top electrode contact window 410. Top electrode contact layer 230 includes leads and pads for top electrode 130. Piezoelectric layer 140 is provided with a bottom electrode contact window 400 that exposes a portion of bottom electrode 150. A bottom electrode contact layer 220 is disposed above piezoelectric layer 140 and is electrically connected to bottom electrode 150 via bottom electrode contact window 400. Bottom electrode contact layer 220 includes leads and pads for bottom electrode 150. Top electrode contact layer 230 and bottom electrode contact layer 220 may include various metals, such as aluminum (Al), copper (Cu), gold (Au), titanium (Ti), tungsten (W), platinum (Pt), etc., or a stacked combination of two or more of these metals.

Figure 1B:
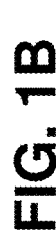
FIG. 1B is a cross-sectional view of a FBAR structure, according to an embodiment of the present disclosure.

FIG. 1B is a cross-sectional view of a FBAR structure 1100, according to an embodiment of the present disclosure. FBAR structure 1100 includes a wafer level packaging (WLP) structure formed above FBAR 1000 illustrated in FIG. 1A. Thus, detailed descriptions of the components of FBAR 1000 are not repeated.

As illustrated in FIG. 1B, FBAR structure 1100 includes an upper cavity 500*b* disposed above piezoelectric stack 145. Upper cavity 500*b* and lower cavity 500*a* provide a reflection layer for an acoustic wave at a solid-gas interface required for the operation of the FBAR resonator.

Upper cavity 500*b* is formed using a WLP process of bonding a top cap wafer 250 onto FBAR structure 1000 through a top bonding layer 240 formed above FBAR structure 1000. As illustrated in FIG. 1B, upper cavity 500*b* is surrounded by top bonding layer 240 and top cap wafer 250. The bonding material layer 240 has a certain thickness and is patterned. Top bonding layer 240 may include silicon oxide, silicon nitride, or organic film materials such as dry film, die attach film, etc. In the present embodiment, top bonding layer 240 includes a dry film. Top cap wafer 250 may include silicon (Si), silicon carbide (SiC), aluminum oxide, quartz or glass, etc. In the present embodiment, top cap wafer 250 includes silicon (Si).

Top bonding layer 240 is provided with a first through hole 420 and a second through hole 430. First through hole 420 exposes a portion of top electrode contact layer 230. Second through hole 430 exposes a portion of bottom electrode contact layer 220. Top cap wafer 250 is provided with a third through hole 441 and a fourth through hole 442. Third through hole 441 is vertically aligned with, and connected to, first through hole 420. Fourth through hole 442 is vertically aligned with, and connected to, second through hole 430. First through hole 420 and third through hole 441 together constitute a top electrode through hole 232 that extends through top bonding layer 240 and top cap wafer 250, and exposes the portion of top electrode contact layer 230. Second through hole 430 and fourth through hole 442 together constitute a bottom electrode through hole 222 that extends through top bonding layer 240 and top cap wafer 250, and exposes the portion of bottom electrode contact layer 220. Top and bottom electrode through holes 232 and 222 are used for external conductive interconnection of FBAR structure 1100.

A conductive layer 260 is formed on the sidewalls of top and bottom electrode through holes 232 and 222 and the surface of top cap wafer 250 near the edges of top and bottom electrode through holes 232 and 222. For example, a first section of conductive layer 260 is disposed on sidewalls of top electrode through hole 232 and the exposed portion of top electrode contact layer 230, and on the surface of top cap wafer 250 near the edge of the top electrode through hole. A second section of conductive layer 260 is disposed on sidewalls of bottom electrode through hole 222 and the exposed portion of bottom electrode contact layer 22, and on the surface of top cap wafer 250 near the edge of the bottom electrode through hole.

A first solder bump 281 is filled in top electrode through hole 232 and electrically connected with the first section of conductive layer 260. A second solder bump 282 is filled in bottom electrode through hole 222 and electrically connected with the second section of the conductive layer 260. Solder bumps 281 and 282 may include an alloy of tin (Sn) and silver (Ag) mixed in a certain ratio. The height of the solder bumps 281 and 282 exceeds a certain height of conductive layer 260 disposed on the surface of top cap wafer 250.

Figure 1C:
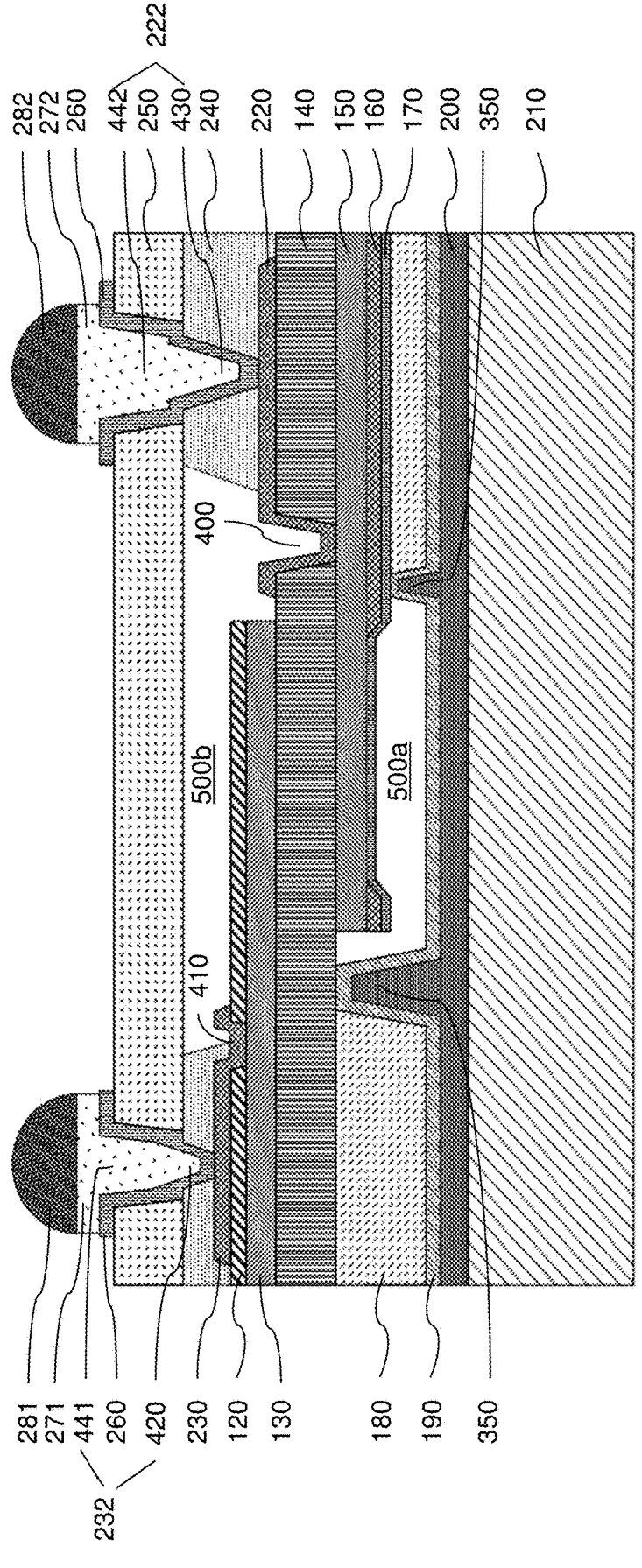
FIG. 1C is a cross-sectional view of a FBAR structure, according to an embodiment of the present disclosure.

FIG. 1C is a cross-sectional view of a FBAR structure 1200, according to an embodiment of the present disclosure. FBAR structure 1200 differs from FBAR structure 1100 in that top and bottom electrode through holes 232 and 222 are filled with metal fillings 271 and 272 respectively. Metal fillings 271 and 272 may include a conductive metal material such as, for example copper (Cu). Solder bumps 281 and 282 are disposed above metal fillings 271 and 272, respectively.

Except for metal fillings 271 and 272 and solder bumps 281 and 282, the components of FBAR structure 1200 are the same as the components of FBAR structure 1100, and therefore detailed descriptions of these components are not repeated.

Figure 1D:
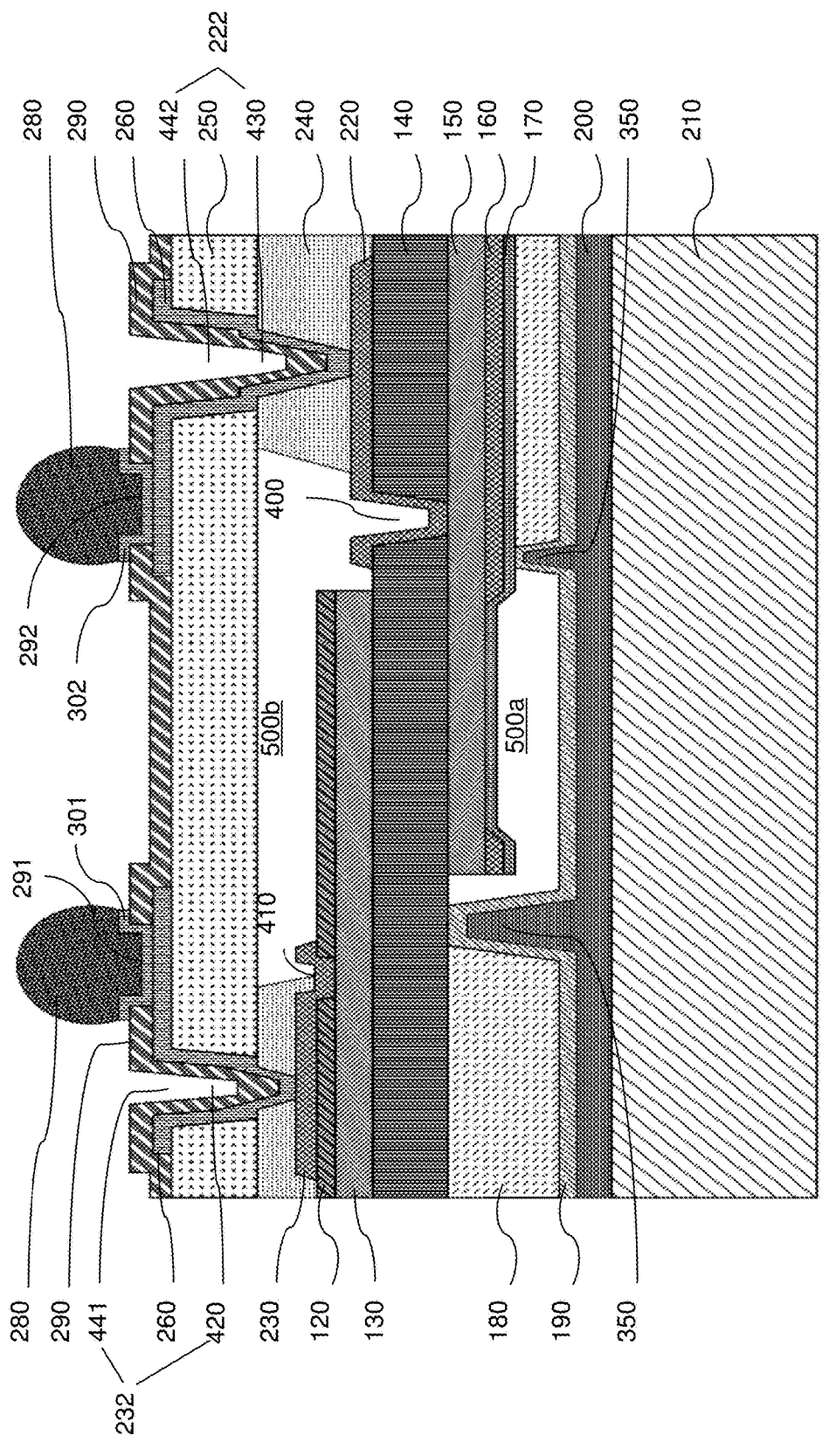
FIG. 1D is a cross-sectional view of a FBAR structure, according to an embodiment of the present disclosure.

FIG. 1D is a cross-sectional view of a FBAR structure 1300, according to an embodiment of the present disclosure. FBAR structure 1300 differs from FBAR structure 1100 or 1200 in that FBAR structure 1300 includes a redistribution layer (RDL) structure formed above FBAR structure 1000 illustrated in FIG. 1A.

For example, as illustrated in FIG. 1D, top and bottom electrode through holes 232 and 222 are not filled with metals or solder materials. Instead, a passivation layer 290 is disposed on top cap wafer 250 and conductive layer 260. Passivation layer 290 may include an organic material such as, for example, polyimide. First and second contact windows 291 and 292 are formed in passivation layer 290, respectively exposing the first and second sections of conductive layer 260. First contact window 291 is not vertically aligned with top electrode through hole 232, and second contact window 292 is not vertically aligned with bottom electrode through hole 222. A first under bump metal (UBM) layer 301 is disposed on sidewalls of first contact window 291, and on the surface of passivation layer 290 near first contact window 291. A second UBM layer 302 is disposed on sidewalls of second contact window 292, and on the surface of passivation layer 290 near the second contact window 292. First and second solder bumps 281 and 282 are disposed above first and second UBM layers 301 and 302, respectively.

Except for passivation layer 290, UBM layers 301 and 302, and solder bumps 281 and 282, the components of FBAR structure 1300 are the same as the components of FBAR structure 1100, and therefore detailed descriptions of these components are not repeated.

FIGS. 2, 3, 4A, 4B, and 5-25 show cross-sectional views of structures formed in a process of fabricating a FBAR structure, according to embodiments of the present disclosure.

Figure 2:
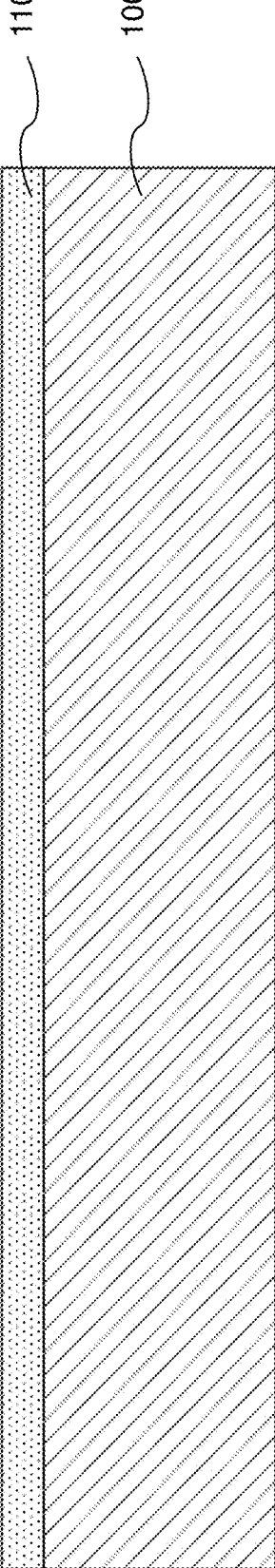
FIGS. 2, 3, 4A, 4B, and 5-25 are cross-sectional views of structures formed in a process of fabricating a FBAR structure, according to an embodiment of the present disclosure.

In step 1 of the fabricating process, as illustrated in FIG. 2, a substrate 100 is obtained, and a silicon oxide layer 110 is formed on substrate 100. Substrate 100 may include silicon (Si), silicon carbide (SiC), aluminum oxide, quartz, or glass, etc. Silicon oxide layer 110 may be obtained by oxidizing a silicon substrate, or may be deposited on substrate 100 through a chemical vapor deposition (CVD) process. In the present embodiment, substrate 100 includes silicon (Si).

Figure 3:
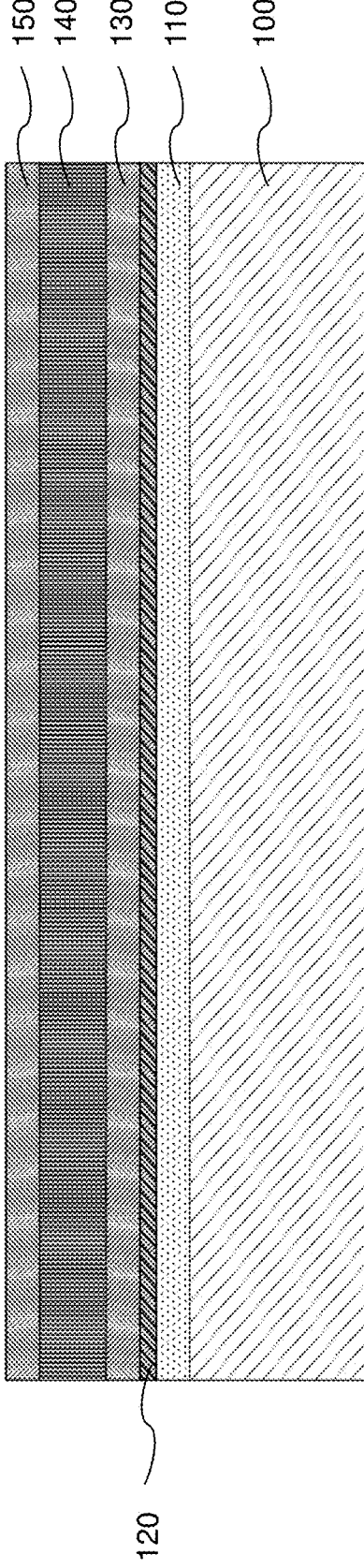

In step 2, as illustrated in FIG. 3, top passivation layer 120 is deposited on the silicon oxide layer 110. Then a top electrode material layer 130, a piezoelectric layer 140, and a bottom electrode material layer 150 are sequentially deposited on top passivation layer 120. Top passivation layer 120 may include aluminum nitride (AlN). Top and bottom electrode material layers 130 and 150 may include any suitable conductive material, such as various metal materials with conductive properties or a stack of several conductive metal materials, such as molybdenum (Mo), aluminum (Al), copper (Cu), platinum (Pt), tantalum (Ta), tungsten (W), palladium (Pd), ruthenium (Ru), etc. In the present embodiment, top and bottom electrode material layers 130 and 150 include molybdenum (Mo). Piezoelectric layer 140 may include materials with piezoelectric properties or their stacked combination, such as aluminum nitride (AlN), zinc oxide (ZnO), lithium niobate (LiNbO3), lithium tantalate (LiTaO3), lead zirconate titanate (PZT), barium strontium titanate (BST), etc. When the material of piezoelectric layer 140 is aluminum nitride (AlN), the aluminum nitride itself may also be doped with a certain proportion of rare earth elements, such as scandium, erbium, lanthanum, etc. In the present embodiment, the material of the piezoelectric layer 140 includes aluminum nitride (AlN) or scandium doped aluminum nitride (ScAlN).

Figure 4A:
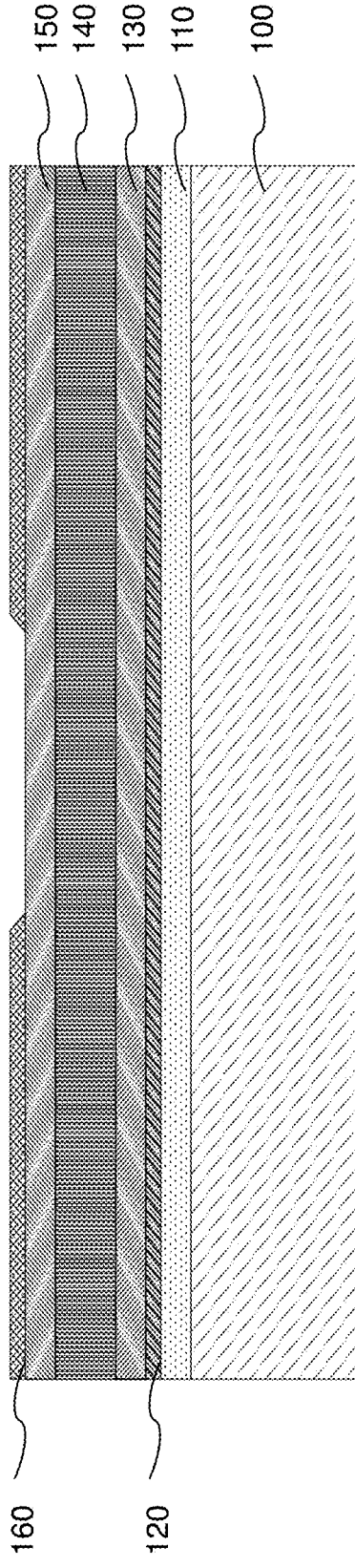

In step 3, as illustrated in FIG. 4A, a frame layer 160 is formed on bottom electrode material layer 150, and then frame layer 160 is patterned. Frame layer 160 may include a conductive material, which may be the same as the material of bottom electrode layer 150 or may be different from the material of bottom electrode layer 150. The patterning of frame layer 160 may be obtained either by using a Lift-off process or by using a patterned etching method.

Figure 4B:
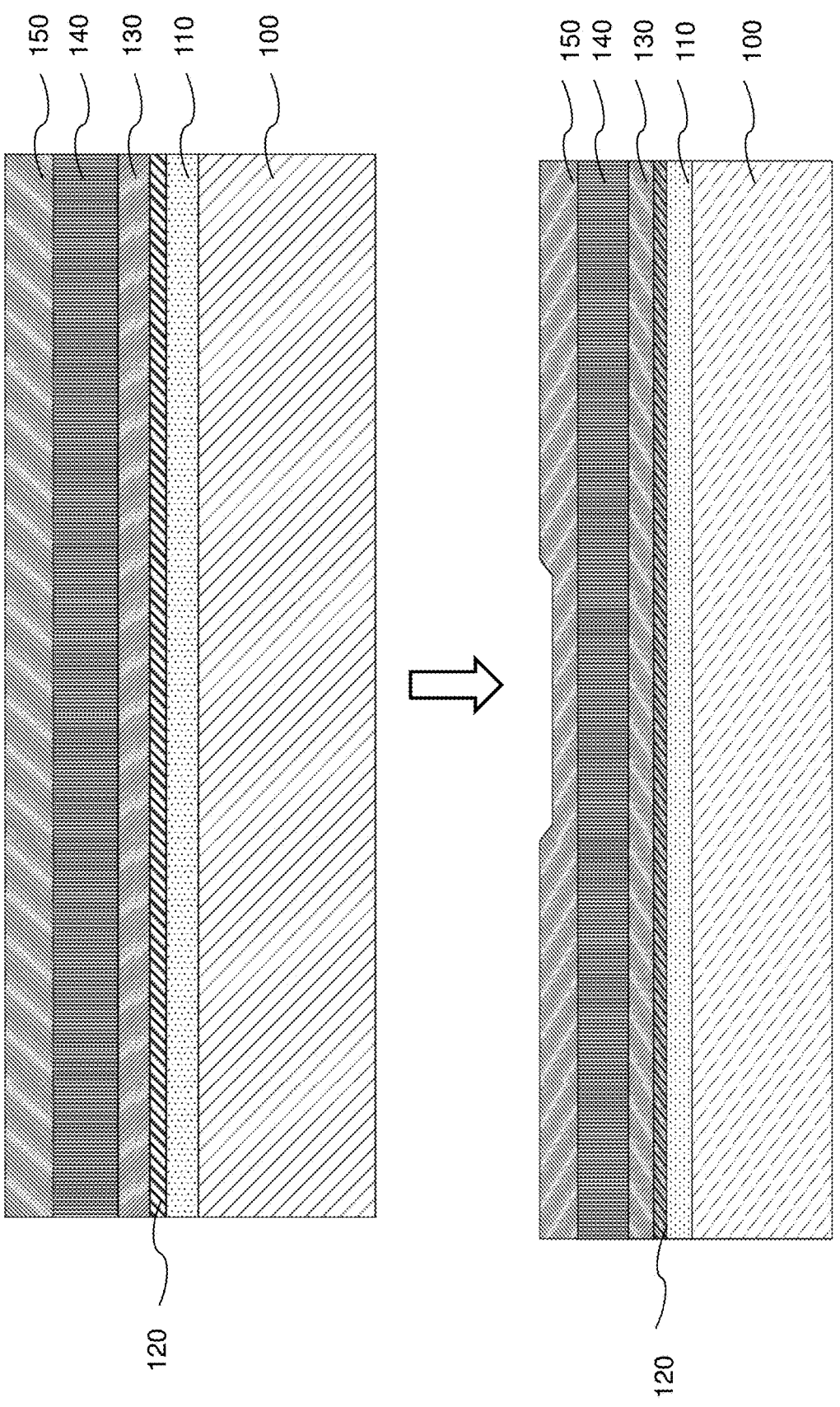

As illustrated in FIG. 4B, in another embodiment, bottom electrode layer 150 and frame layer 160 in FIG. 4A are made from the same metal material, and a metal layer 150 with a total thickness of bottom electrode layer 150 and frame layer 160 in FIG. 4A is deposited on piezoelectric layer 140. Then, metal layer 150 is patterned and etched to a certain extent to form the raised edge structure provided by frame layer 160 illustrated in FIG. 4A.

Figure 5:
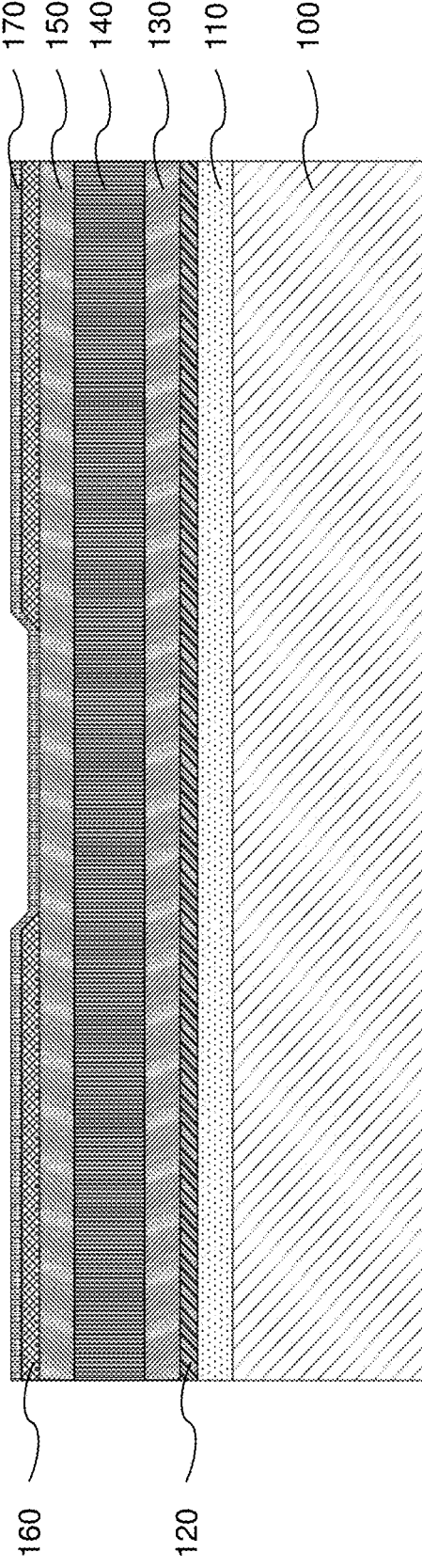

In step 4, as illustrated in FIG. 5, bottom passivation layer 170 is deposited on the surfaces of bottom electrode layer 150 and frame layer 160. The material of bottom passivation layer 170 may be silicon nitride (SiN), aluminum nitride (AlN), Silicon oxide (SiO2), silicon oxynitride (SiNO), or other materials, or a stacked combination of two or more of these materials.

Figure 6:
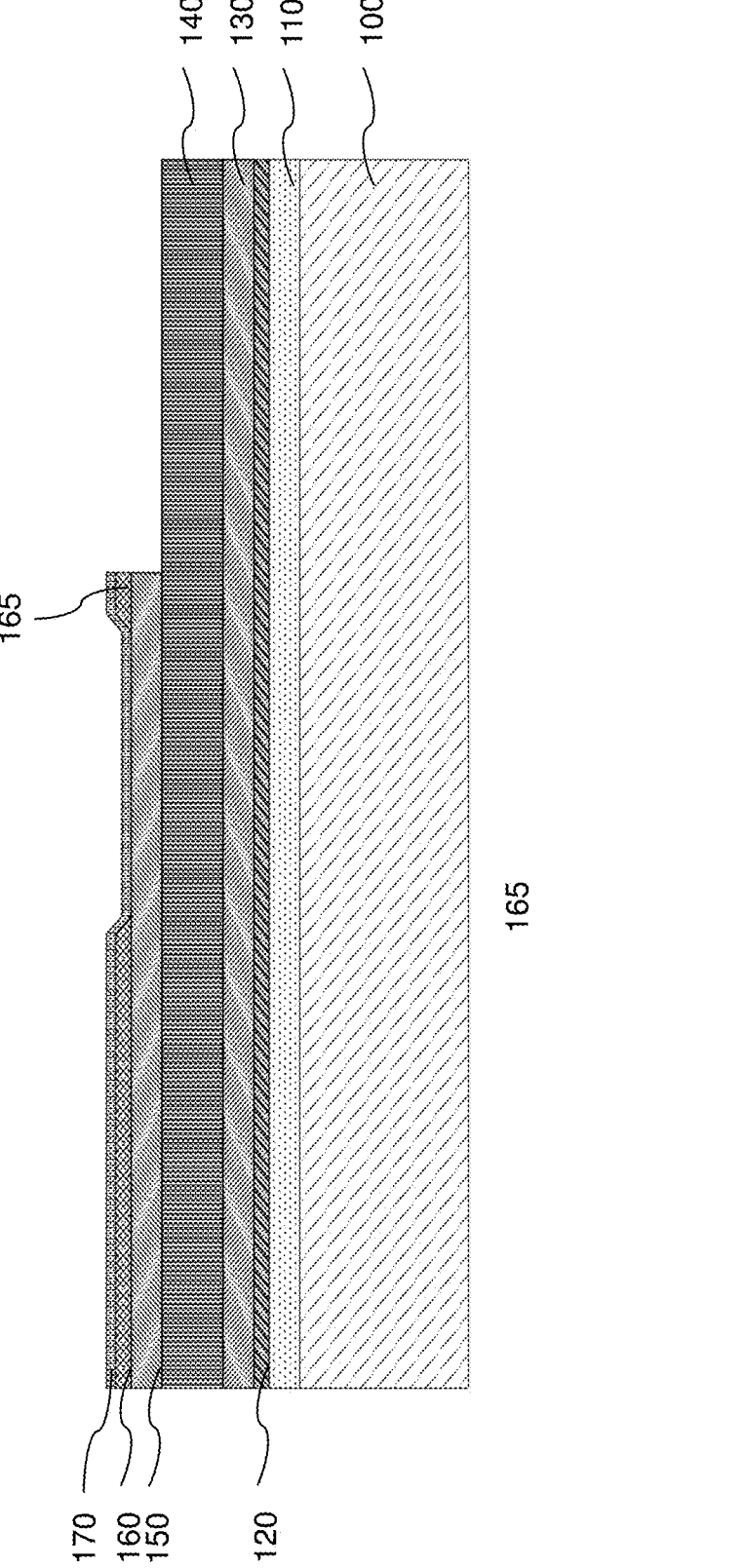

In step 5, as illustrated in FIG. 6, bottom passivation layer 170, frame layer 160 and bottom electrode layer 150 are patterned to form patterned bottom electrode 150, as well as raised structure 165 at an edge of bottom electrode 150. The patterning may be achieved by etching, such as a plasma etching process, a wet chemical etching process, or a combination of the two. As a result of the patterning, an accurate pattern of bottom electrode 150 may be realized.

Figure 7:
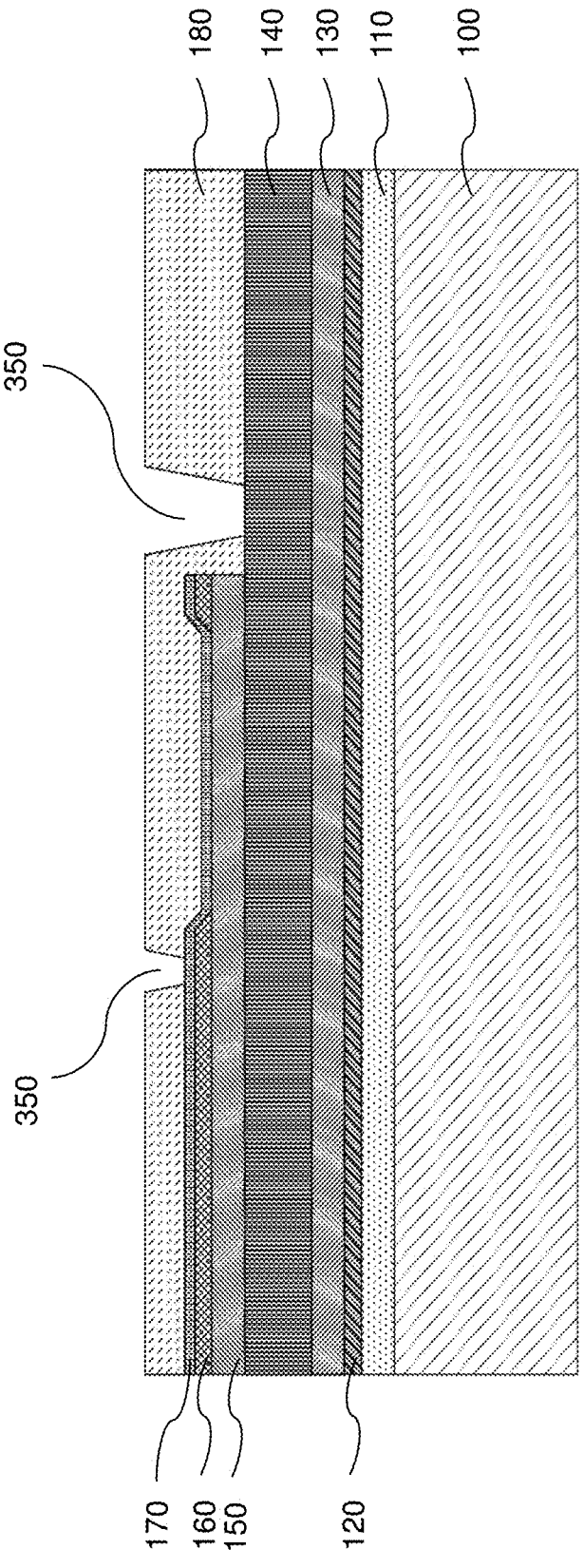

In step 6, as illustrated in FIG. 7, a sacrificial layer 180 is deposited and patterned by etching to form trench 350. The material of sacrificial layer 180 may be silicon oxide. A part of sacrificial layer 180 will be removed during a subsequent release etching process, thereby forming lower cavity 500*a*. Trench 350 is used to define the range of lower cavity 500*a*.

Figure 8:
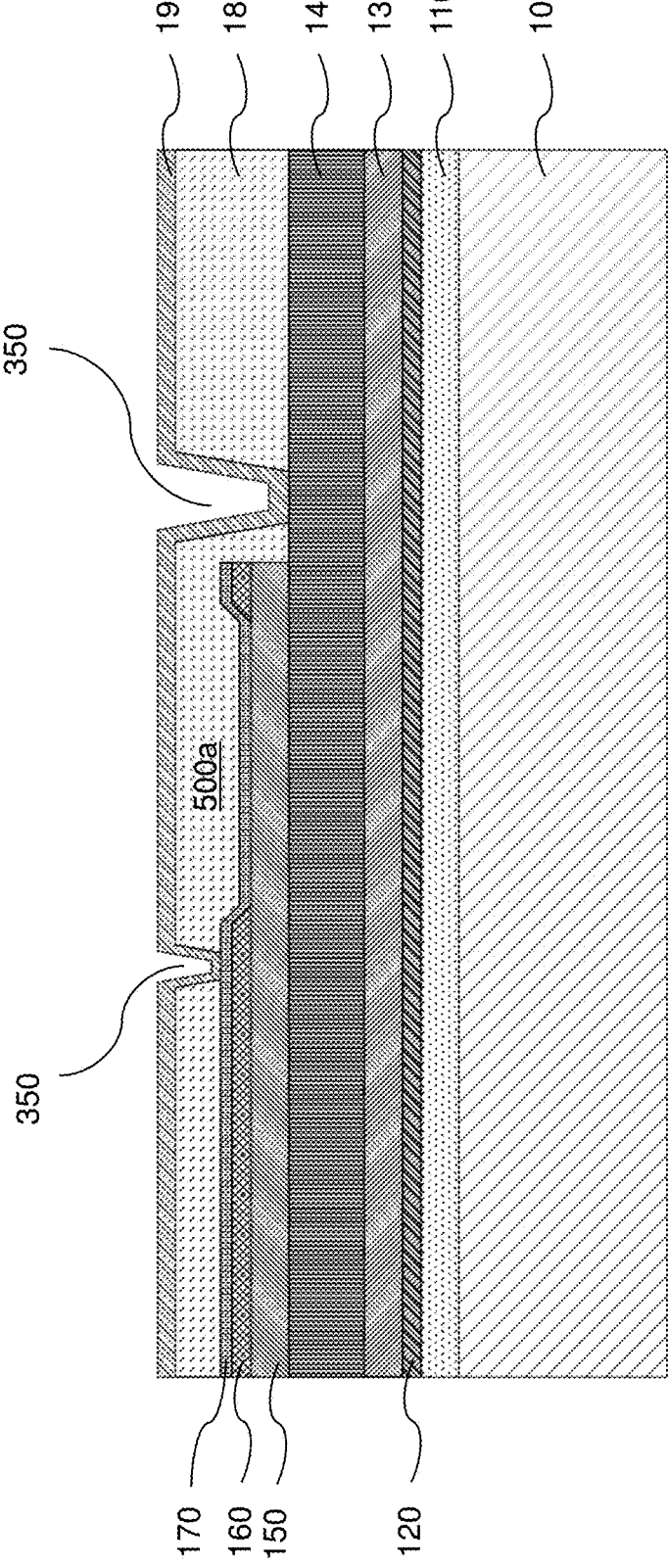

In step 7, as illustrated in FIG. 8, boundary layer 190 is deposited. The material of boundary layer 190 may be silicon (Si), silicon nitride (SiN), aluminum nitride (AlN), or other non-conductive materials, or a stacked combination of two or more of these materials. Boundary layer 190 is deposited in trench 350, thereby defining a stop boundary during the subsequent release etching process for defining lower cavity 500*a*. In the present embodiment, because the patterning of bottom electrode 150 is performed before lower cavity 500*a* is defined, the patterning of bottom electrode 150 may be precisely controlled, thereby minimizing parasitic capacitance resulted from inaccurate patterning of bottom electrode.

Figure 9:
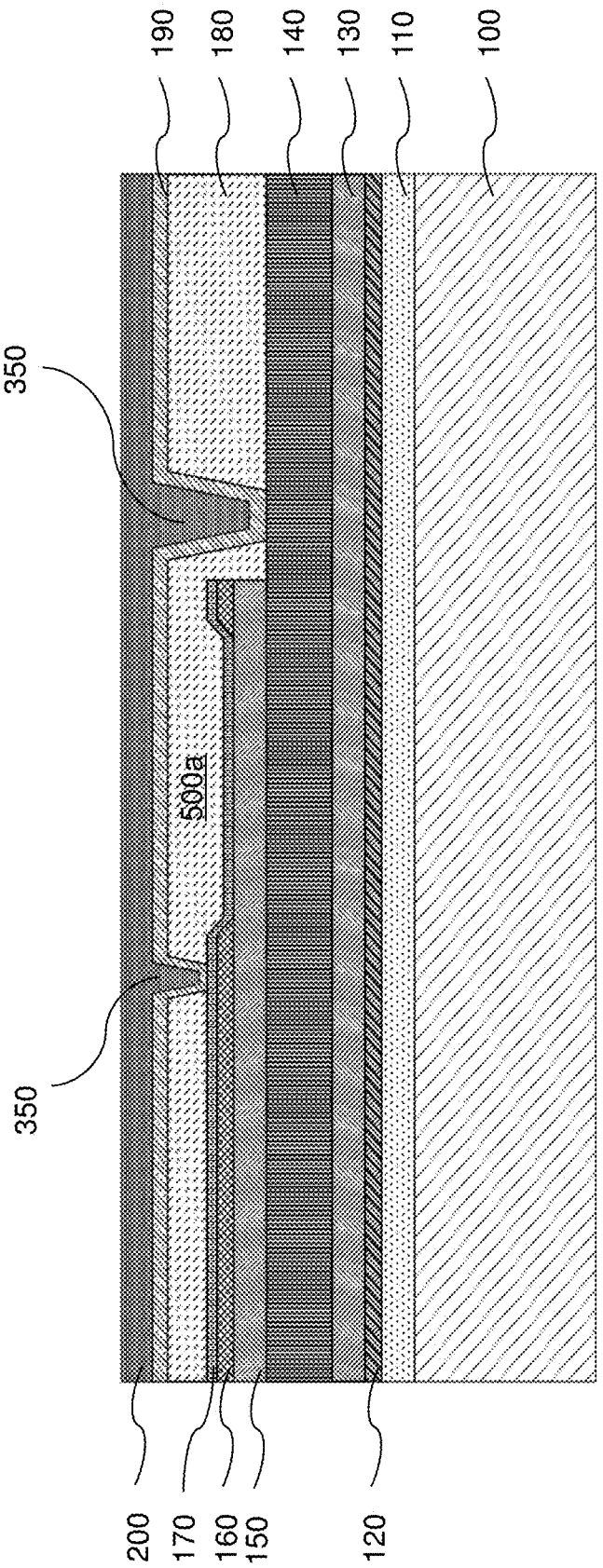

In step 8, as illustrated in FIG. 9, bottom bonding layer 200 is deposited. Then, surface planarization and polishing are performed on bottom bonding layer 200. Bottom bonding layer 200 is used to bond bottom cap wafer 210. The material of bottom bonding layer 200 may be silicon oxide, silicon nitride, or other materials, or a stacked combination of two or more of these materials. In the present embodiment, silicon oxide is used for bottom bonding layer 200. The surface planarization and polishing may be performed by a chemical mechanical polishing (CMP) process.

Figure 10:
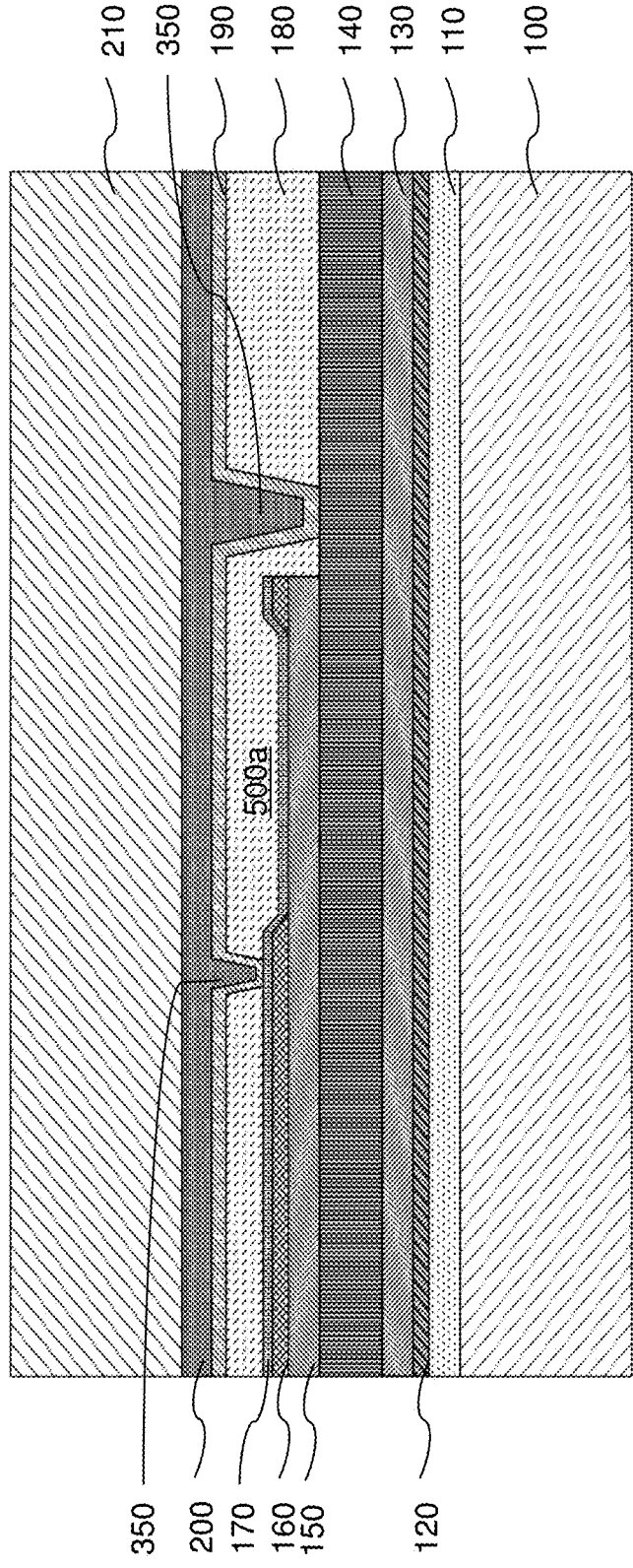

In step 9, as illustrated in FIG. 10, bottom cap wafer 210 is bonded to bottom bonding layer 200. Bottom cap wafer 210 may be a cap wafer that includes a material such as silicon (Si), carbon silicon (SiC), aluminum oxide, quartz, glass (SiO₂), or sapphire (Al₂O₃). In the present embodiment, bottom cap wafer 210 includes silicon (Si).

Figure 11:
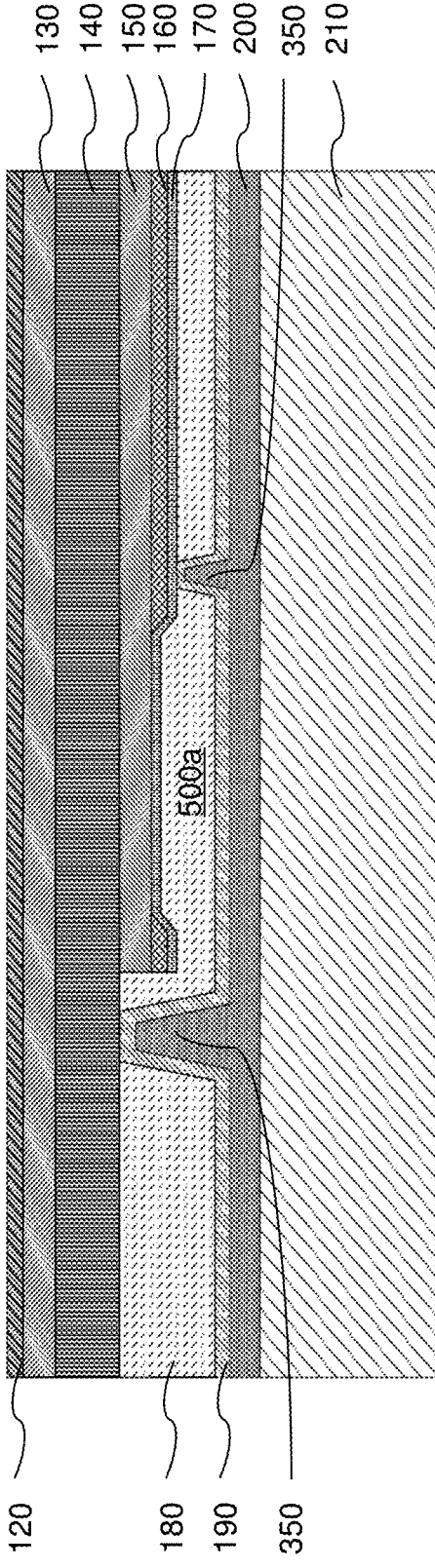

In step 10, the structure illustrated in FIG. 10 is flipped over, and as illustrated in FIG. 11, substrate 100 and silicon oxide layer 110 are removed. The removing of substrate 100 may be performed by a grinding process, a plasma dry etching process, a wet chemical etching process, or a combination thereof. In the present embodiment, substrate 100 is made of silicon material, and is removed by a combination of grinding and wet chemical etching, or a combination of grinding and plasma dry etching. Silicon oxide layer 110 may be removed by plasma dry etching, wet chemical etching, or a combination of the two.

Figure 12:
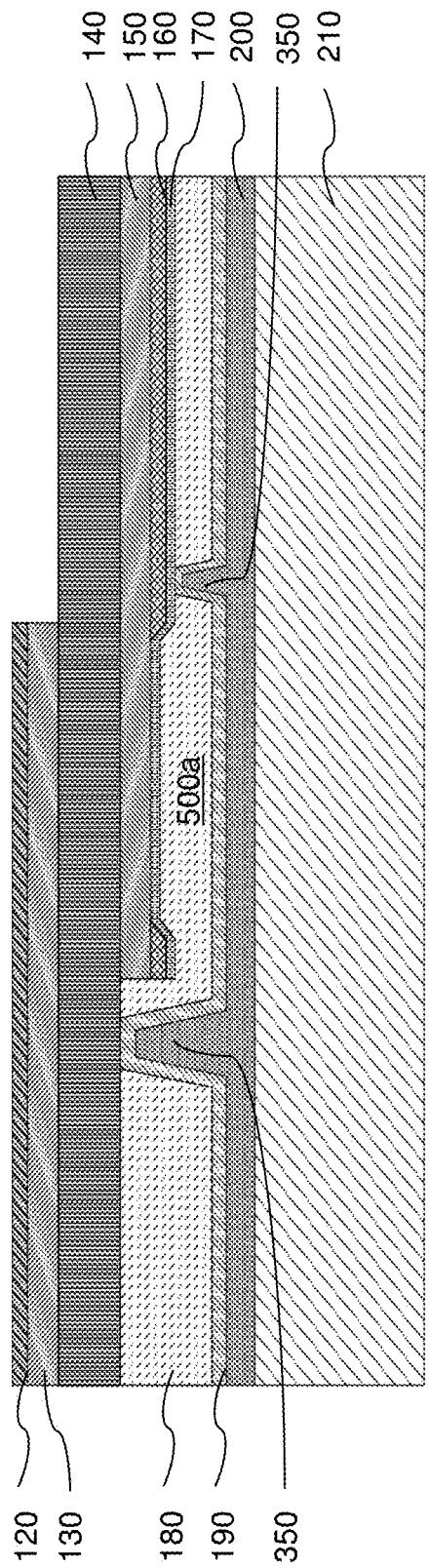

In step 11, as illustrated in FIG. 12, top passivation layer 120 and top electrode material layer 130 are patterned by etching, to form patterned top passivation layer 120 and top electrode 130. The etching process may be a plasma etching process, a wet chemical etching process, or a combination of the two. This step allows for precise patterning of top electrode 130. In combination of the precise patterning of bottom electrode 150, parasitic capacitance may be minimized.

Figure 13:
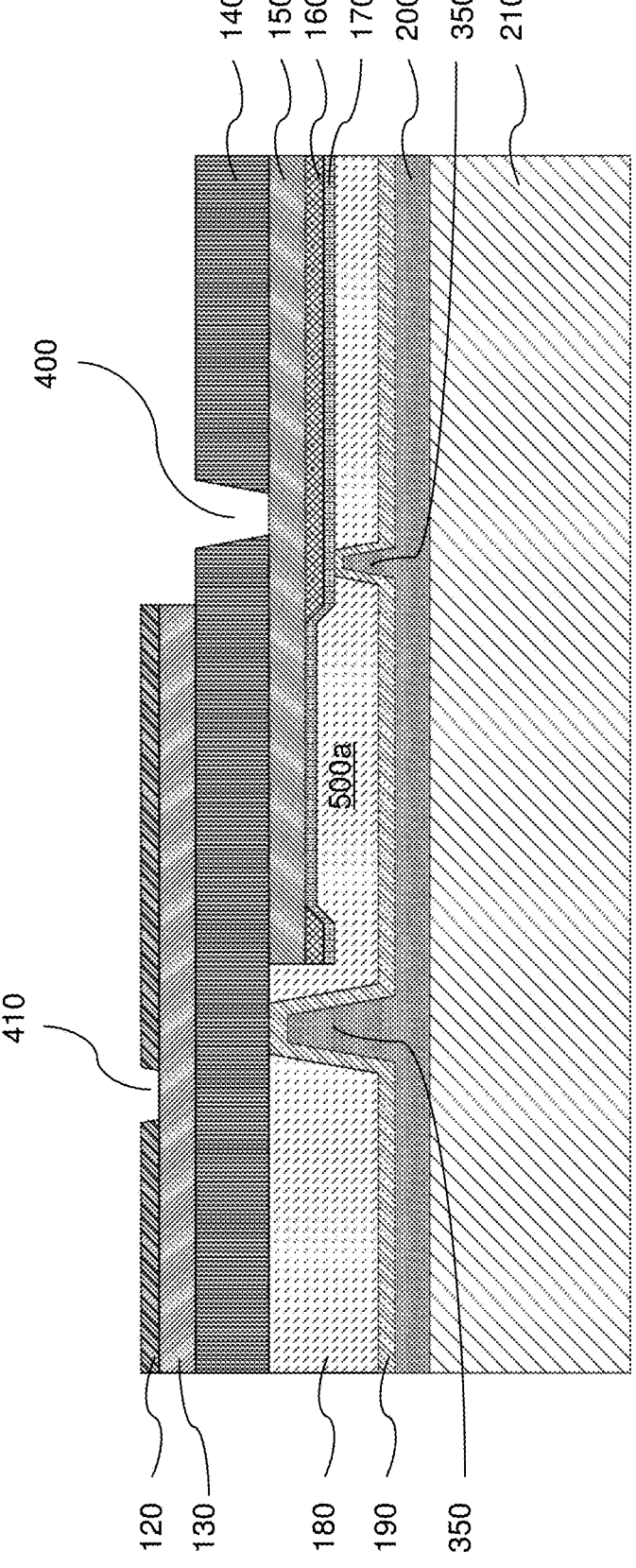

In step 12, as illustrated in FIG. 13, piezoelectric layer 140 is etched to form bottom electrode contact window 400 for bottom electrode 150. Top passivation layer 120 is etched to form top electrode contact window 410 for top electrode 130.

Figure 14:
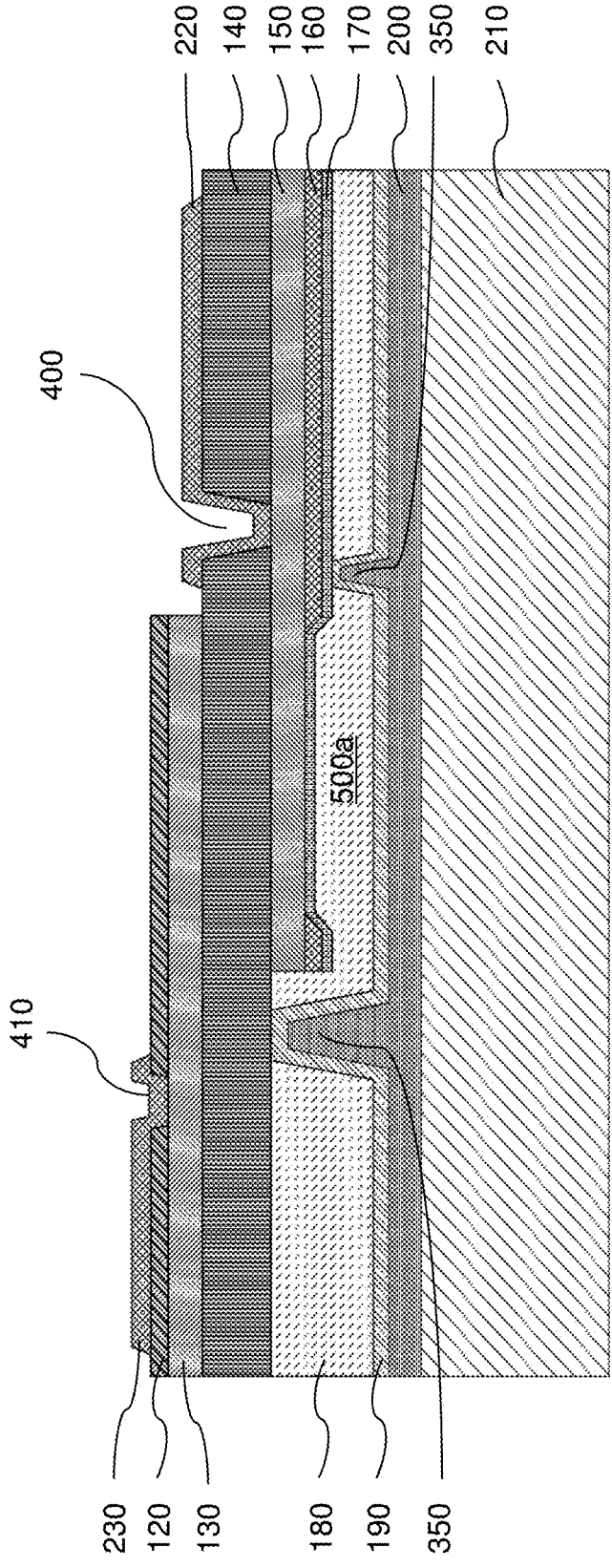

In step 13, as illustrated in FIG. 14, top electrode contact layer 230 of top electrode 130, and bottom electrode contact layer 220 of bottom electrode 150, are formed. The material of top electrode contact layer 230 and bottom electrode contact layer 220 may be metal materials, such as aluminum (Al), copper (Cu), gold (Au), titanium (Ti), tungsten (W), platinum (Pt), etc., or a stacked combination of two or three of these materials.

Figure 15:
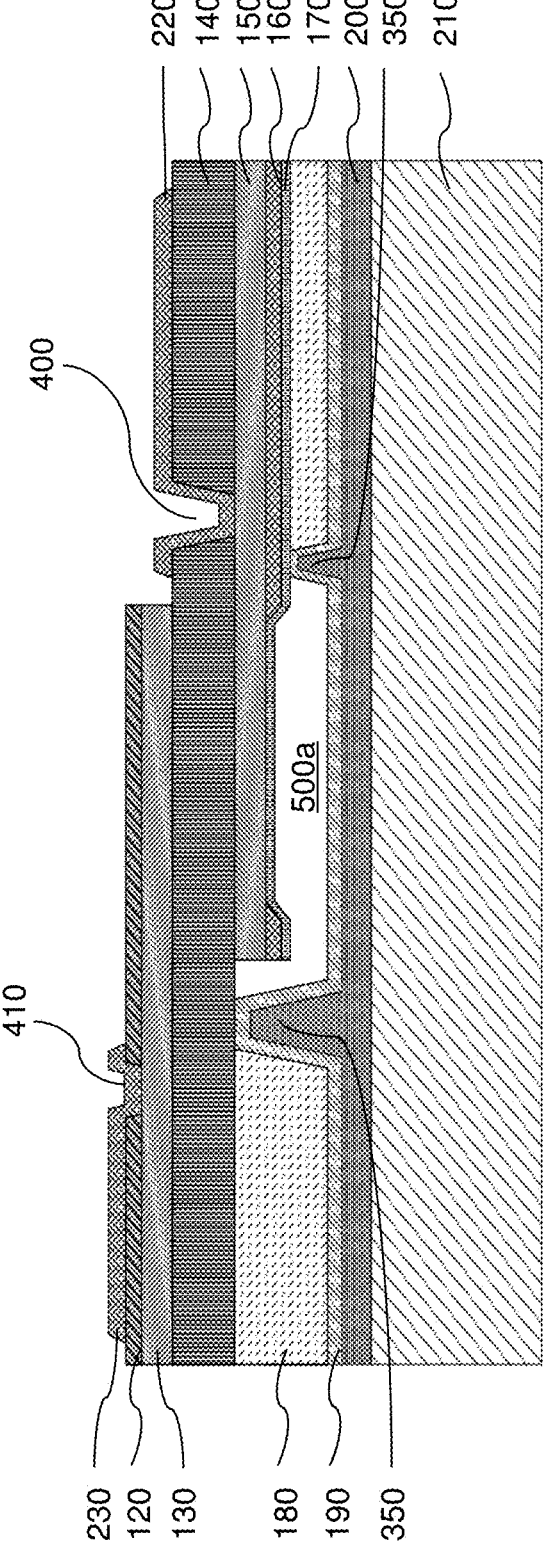

In step 14, as illustrated in FIG. 15, a portion of piezoelectric layer 140 disposed above sacrificial layer 180 is etched to form a releasing hole for removing a portion of sacrificial layer 180 to form lower cavity 500*a*. Due to the location of the cross-section illustrated in FIG. 15, FIG. 15 does not show the location of the releasing hole. After the releasing hole is formed, sacrificial layer 180 is etched to form lower cavity 500*a*. After forming lower cavity 500*a*, FBAR structure 1000 illustrated in FIG. 1A is fabricated. In the present embodiment, sacrificial layer 180 is made from silicon oxide, and the etching and releasing process of sacrificial layer 180 may be performed by using hydrofluoric acid solution wet etching, buffered oxide etchant (BOE) solution wet etching, or hydrofluoric acid vapor corrosion, or a combination of these processes. The boundary of lower cavity 500*a* is defined by boundary layer 190 formed within trench 350.

Figure 16:
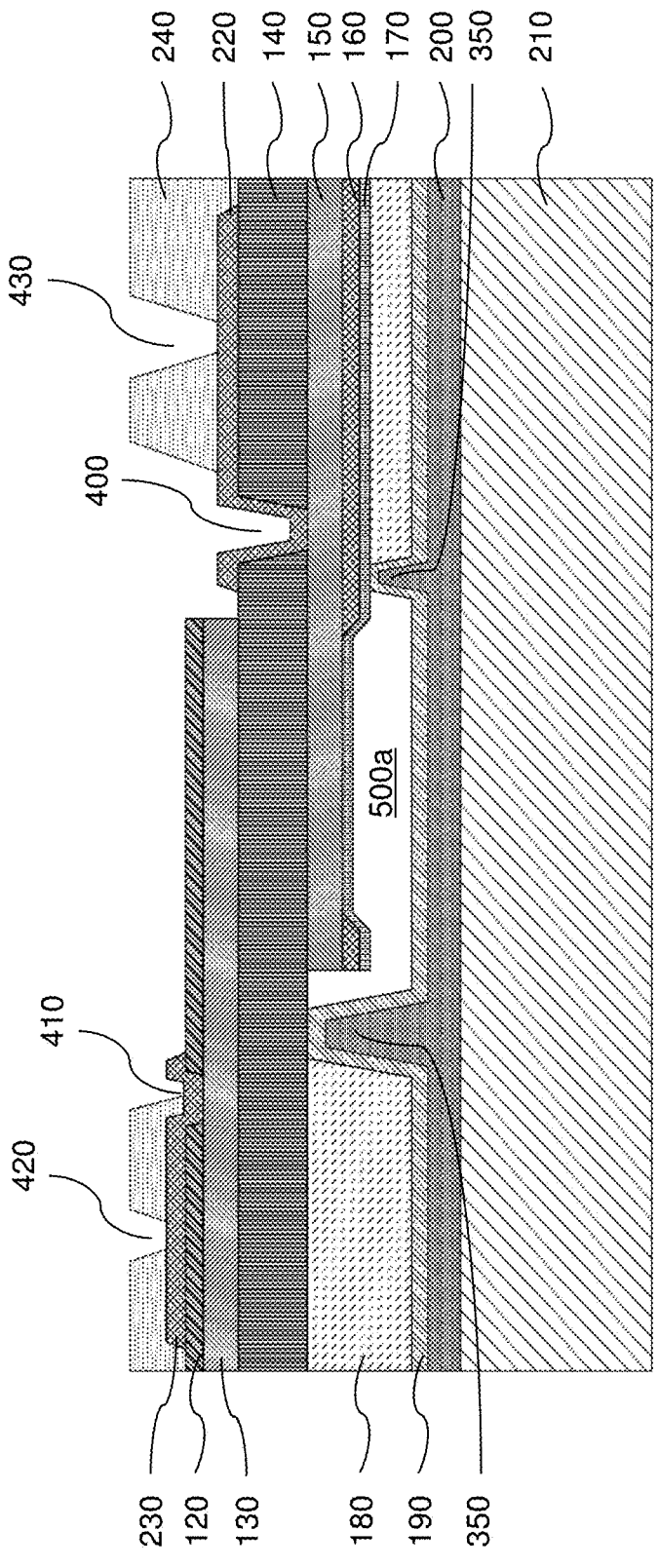

In step 15, as illustrated in FIG. 16, top bonding layer 240 is formed above the structure illustrated in FIG. 15. Then, top bonding layer 240 is patterned to form first and second through holes 420 and 430 for top and bottom electrodes 130 and 150, respectively. First through hole 420 exposes a portion of top electrode contact layer 230, and is not vertically aligned with top electrode contact window 410 that exposes a portion of top electrode 130. Likewise, second through hole 430 exposes a portion of bottom electrode contact layer 220, and is not vertically aligned with bottom electrode contact window 400 that exposes a portion of bottom electrode 150. Top bonding layer 240 may be made of silicon oxide, silicon nitride, organic film materials such as dry film and die attach film, etc. In the present embodiment, top bonding layer 240 is made of dry film.

Figure 17:
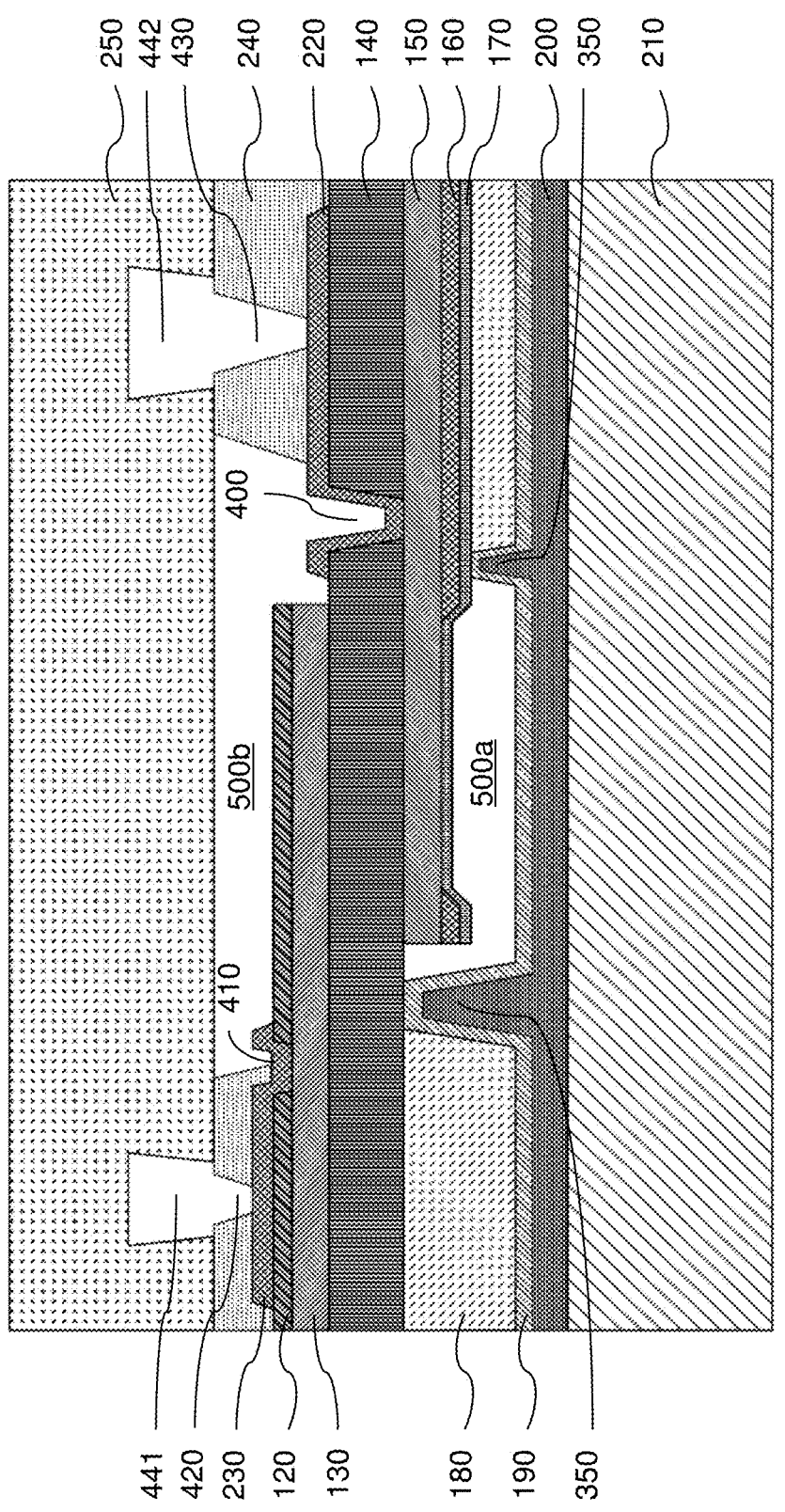

In step 16, as illustrated in FIG. 17, top cap wafer 250 is bonded to top bonding layer 240 to form upper cavity 500*b* of the FBAR structure. The material of top cap wafer 250 may be silicon (Si), carbon silicon (SiC), aluminum oxide, quartz, or glass, etc. In the present embodiment, top cap wafer 250 is made of silicon. Partial through holes 441 and 442 are formed on a surface of top cap wafer 250 facing top bonding layer 240. After bonding, partial through holes 441 and 442 are vertically aligned with first and second through holes 420 and 430, respectively.

Figure 18:
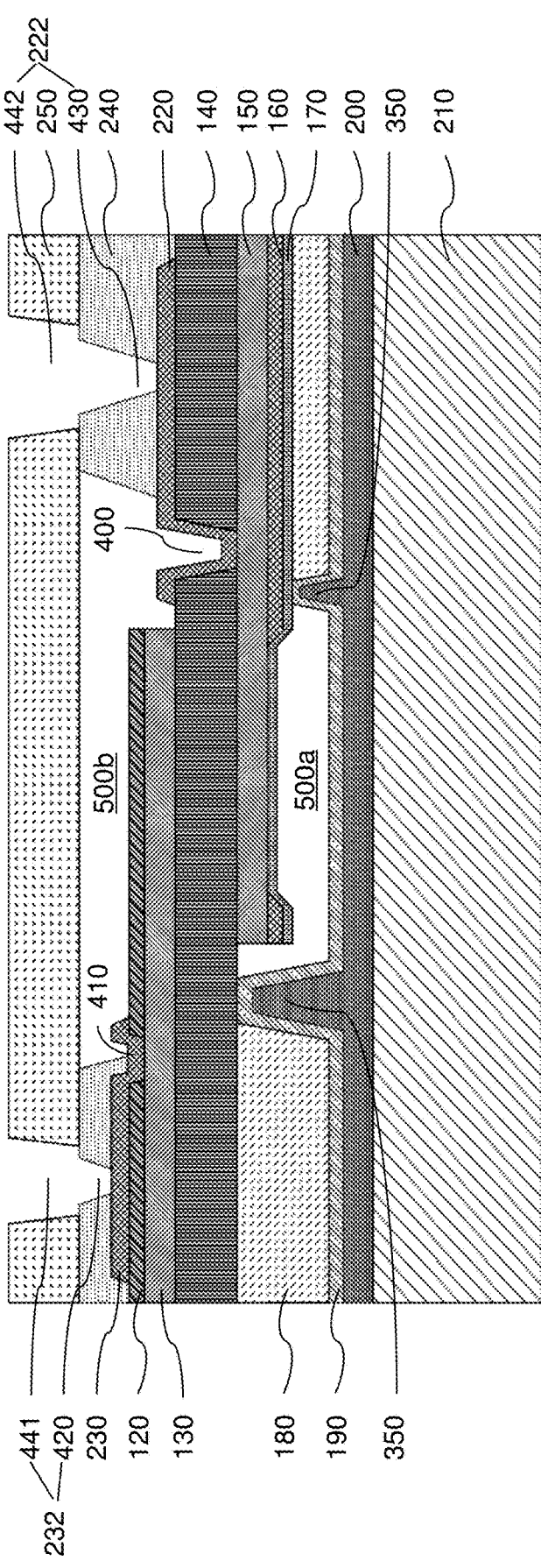

In step 17, as illustrated in FIG. 18, top cap wafer 250 is thinned to expose partial through holes 441 and 442. As a result, partial through holes 441 and 442 become third and fourth through holes 441 and 442. First through hole 420 and third through hole 441 together constitute top electrode through hole 232. Second through hole 420 and fourth through hole 442 together constitute bottom electrode through hole 222. The thinning process may be performed by grinding, plasma etching, wet chemical etching, or a combination thereof. In the present embodiment, top cap wafer 250 is made from silicon, which is thinned using a grinding process.

Figure 19:
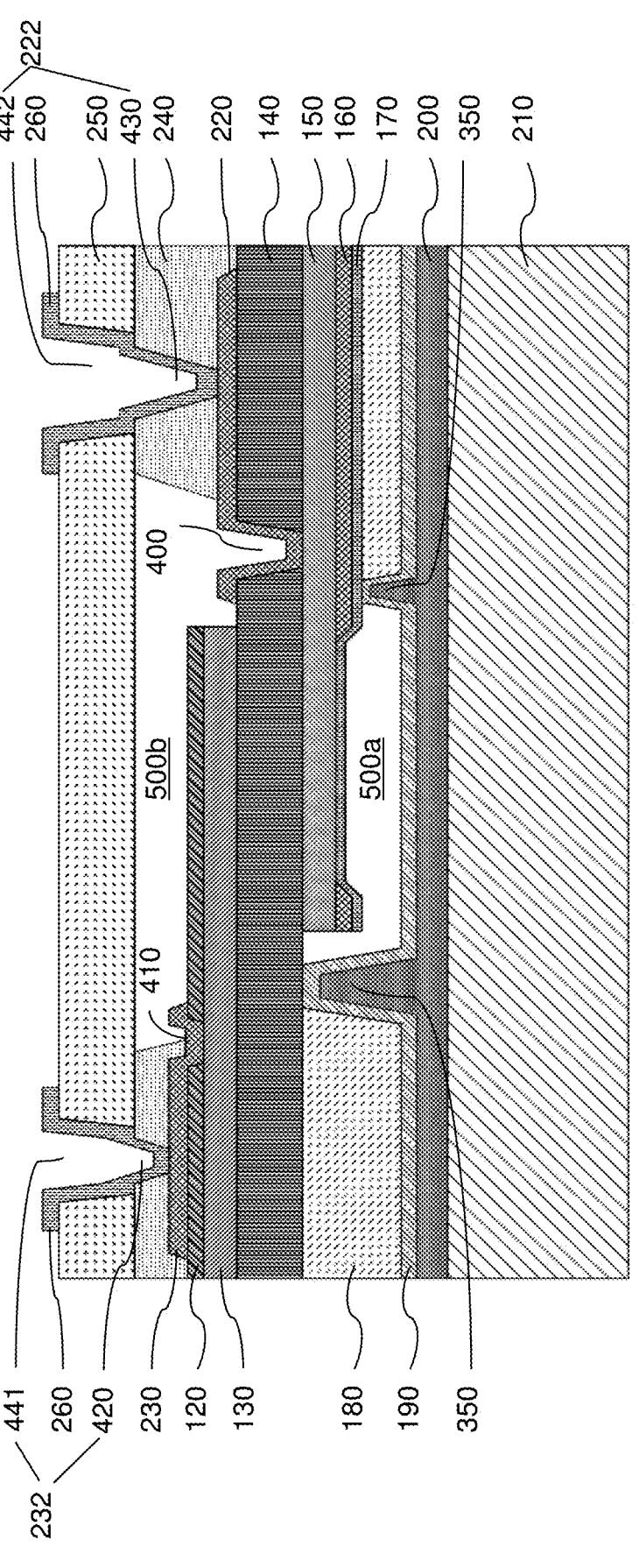

In step 18, as illustrated in FIG. 19, a conductive layer is deposited on top cap wafer 250. Then, conductive layer 260 is patterned by etching, forming conductive layer 260 on the sidewall of top and bottom electrode through holes 232 and 222 and the surface of top cap wafer 250 near the edges of top and bottom electrode through holes 232 and 222. Conductive layer 260 may be made of a metal material, such as aluminum (Al), copper (Cu), gold (Au), titanium (Ti), tungsten (W), platinum (Pt), etc., or a stacked combination of two or more of these metal materials.

Figure 20:

In step 19, as illustrated in FIG. 20, first and second solder bumps 281 and 282 are formed by filling top and bottom electrode through holes 232 and 222, respectively. As a result, FBAR structure 1100 illustrated in FIG. 1B is fabricated. Solder bumps 281 and 282 may made from an alloy of tin (Sn) and silver (Ag) mixed in a predetermined ratio.

Figure 21:
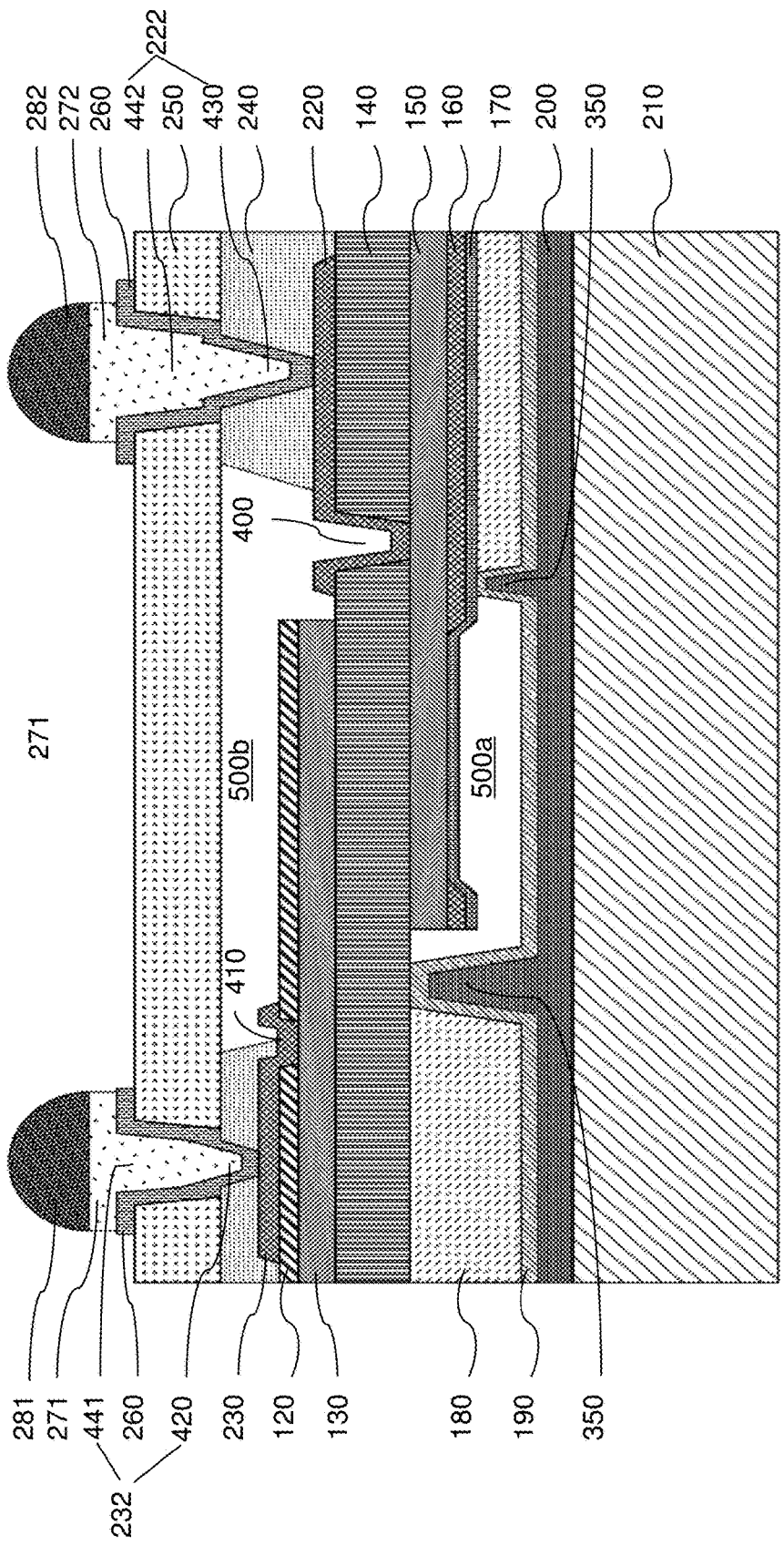

As illustrated in FIG. 21, in an alternative embodiment, first and second metal fillings 271 and 272 are respectively filled in top and bottom electrode through holes 232 and 222. Metal fillings 271 and 272 may be made from a conductive metal material such as, for example copper (Cu). Then, first and second solder bumps 281 and 282 are respectively formed on top of first and second metal fillings 271 and 272. As a result, FBAR structure 1200 illustrated in FIG. 1C is fabricated.

In the embodiments illustrated in FIGS. 20 and 21, both of metal fillings 271 and 272, and solder bumps 281 and 282, may be formed by electroplating. Because solder bumps 281 and 282 are formed directly in or above top and bottom electrode through holes 232 and 222, there is no need for cumbersome redistribution layers and processes, thereby lowering the manufacturing cost. At the same time, because solder bumps 281 and 282 (in FIG. 20), or metal fillings 271 and 272 and solder bumps 281 and 282 (in FIG. 21), are rooted in through holes 441 and 442 defined by top cap wafer 250, which has a lower probability to deform, the entire solder bump structure has higher reliability, and is more adaptable to a harsh processing environment of a subsequent printed circuit board (PCB) board-level packaging process, and to harsh product use conditions. Additionally, because the entire top and bottom electrode through holes 232 and 222 are filled with metal which has a higher thermal conductivity, top and bottom electrode through holes 232 and 222 have a better thermal conductivity, which is beneficial to improve power handling capability of a FBAR device including FBAR structure 1100 or 1200.

The above-described steps 15, 16, and 17 are the steps of forming upper cavity 500b and forming top and bottom electrode through holes 232 and 222. In addition to the above-described embodiments, upper cavity 500b and top and bottom electrode through holes 232 and 222 may also be formed in the embodiments described below.

Figure 22:
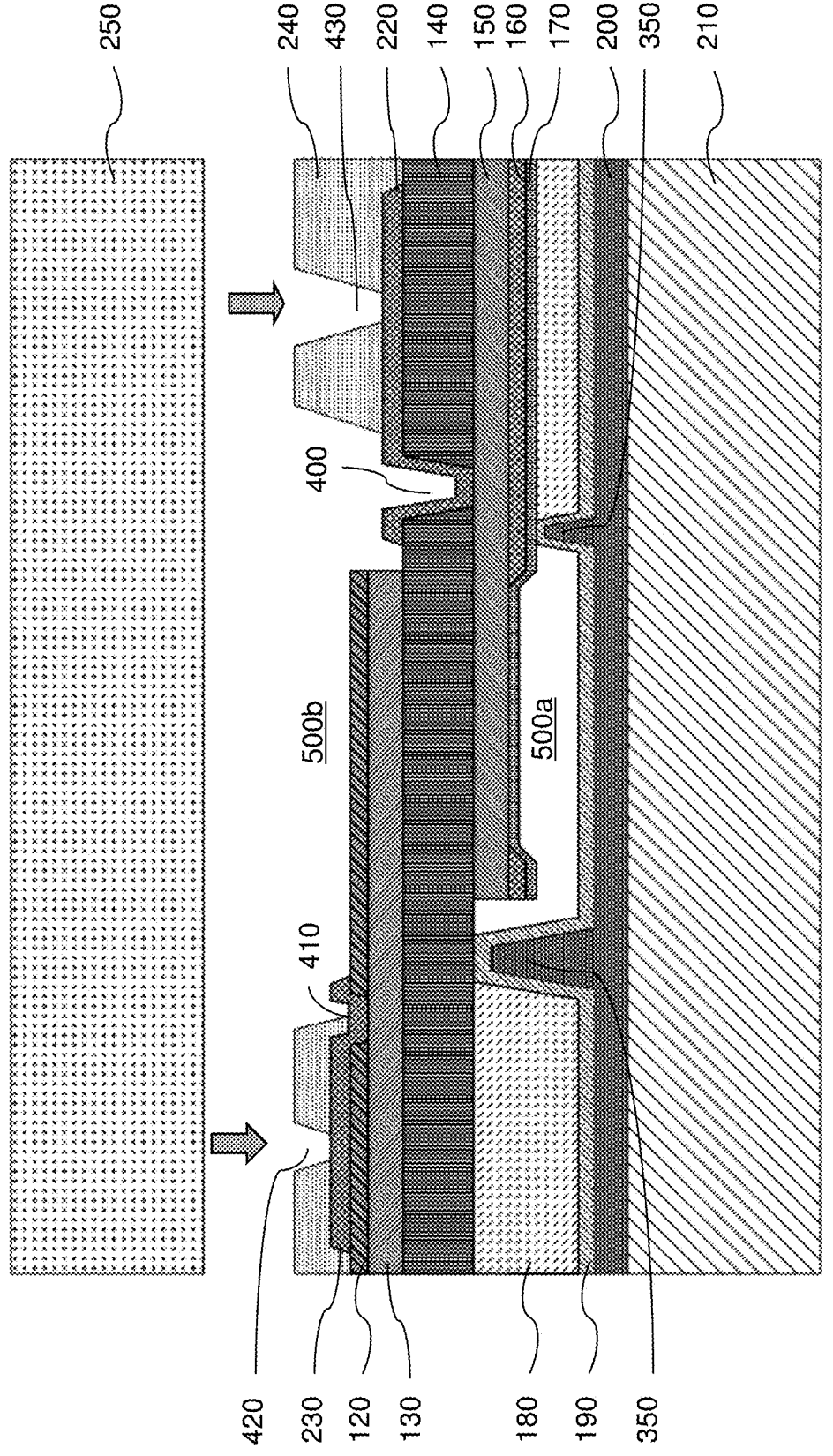

As illustrated in FIG. 22, in an alternative embodiment, top cap wafer 250 is not pre-formed with through holes 441 and 442 illustrated in FIG. 21. Instead, after top cap wafer 250 is bonded to top bonding layer 240, top cap wafer 250 is thinned and then etched to form through holes 441 and 442 illustrated in FIG. 21.

Figure 23:
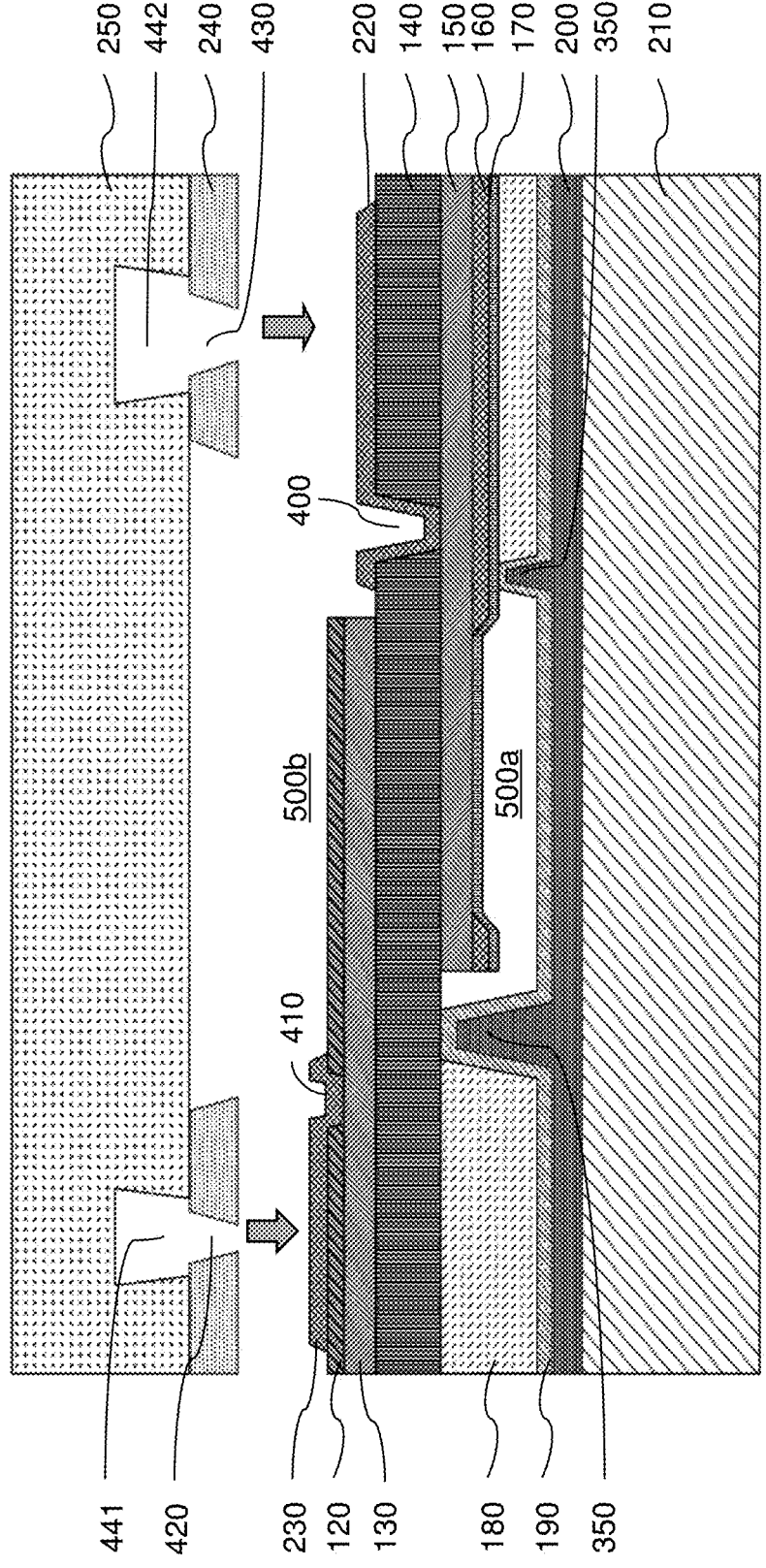

As illustrated in FIG. 23, in still an alternative embodiment, through holes 441 and 442 are formed on top cap wafer 250. Then, top bonding layer 240 is formed on a lower surface of top cap wafer 250, and is patterned to obtain through holes 420 and 430. Next, top cap wafer 250 is bonded to the surface of the structure illustrated in FIG. 14 via top bonding layer 240. Afterwards, top cap wafer 250 is thinned to expose through holes 441 and 442.

Figure 24:
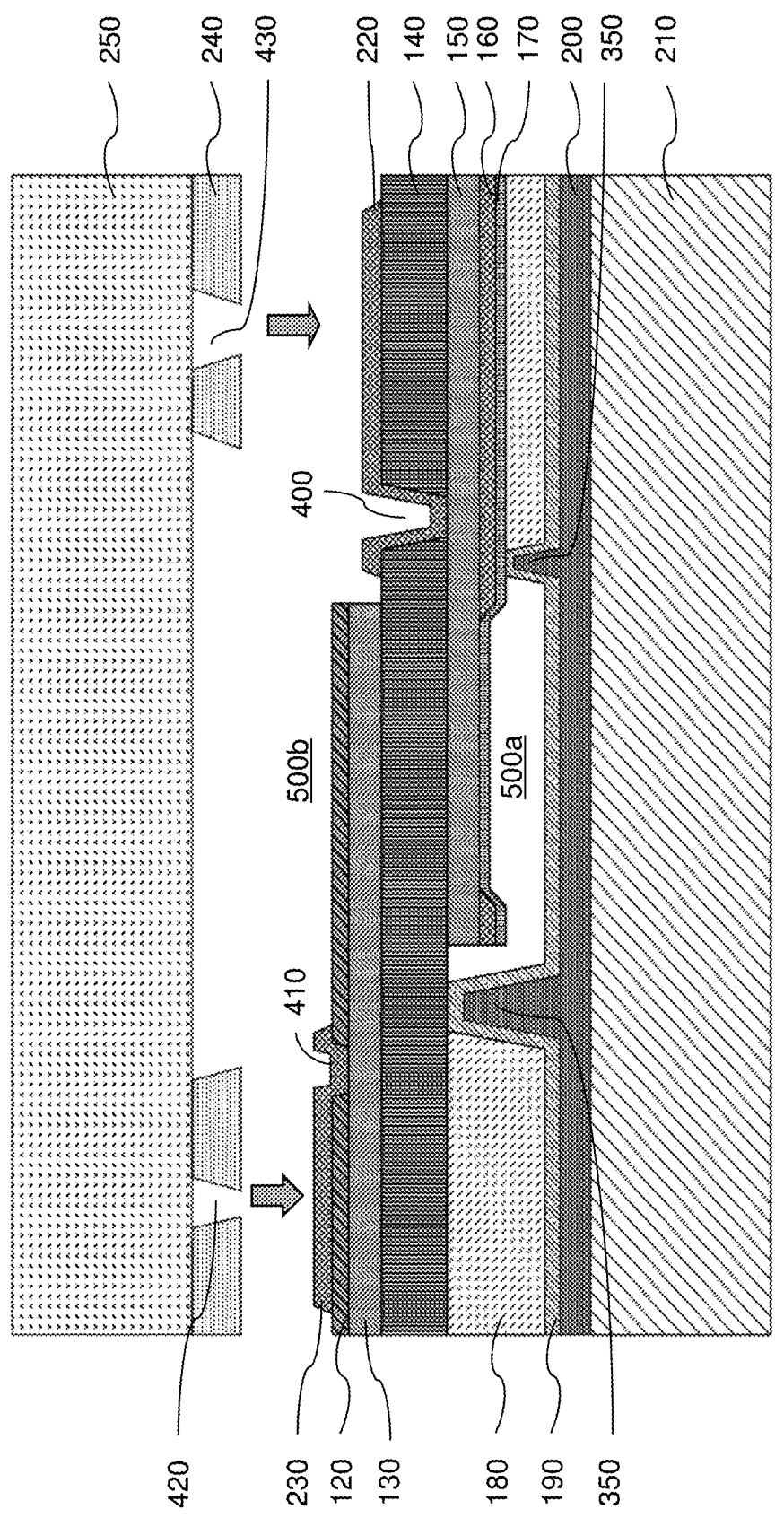

As illustrated in FIG. 24, in still an alternative embodiment, top bonding layer 240 is directly formed on the lower surface of top cap wafer 250, and is patterned to form through holes 420 and 430. Then, top cap wafer 250 is bonded to the surface of the structure illustrated in FIG. 14 via top bonding layer 240. Afterwards, top cap wafer 250 is thinned, and patterned to form through holes 441 and 442 are etched.

Figure 25:
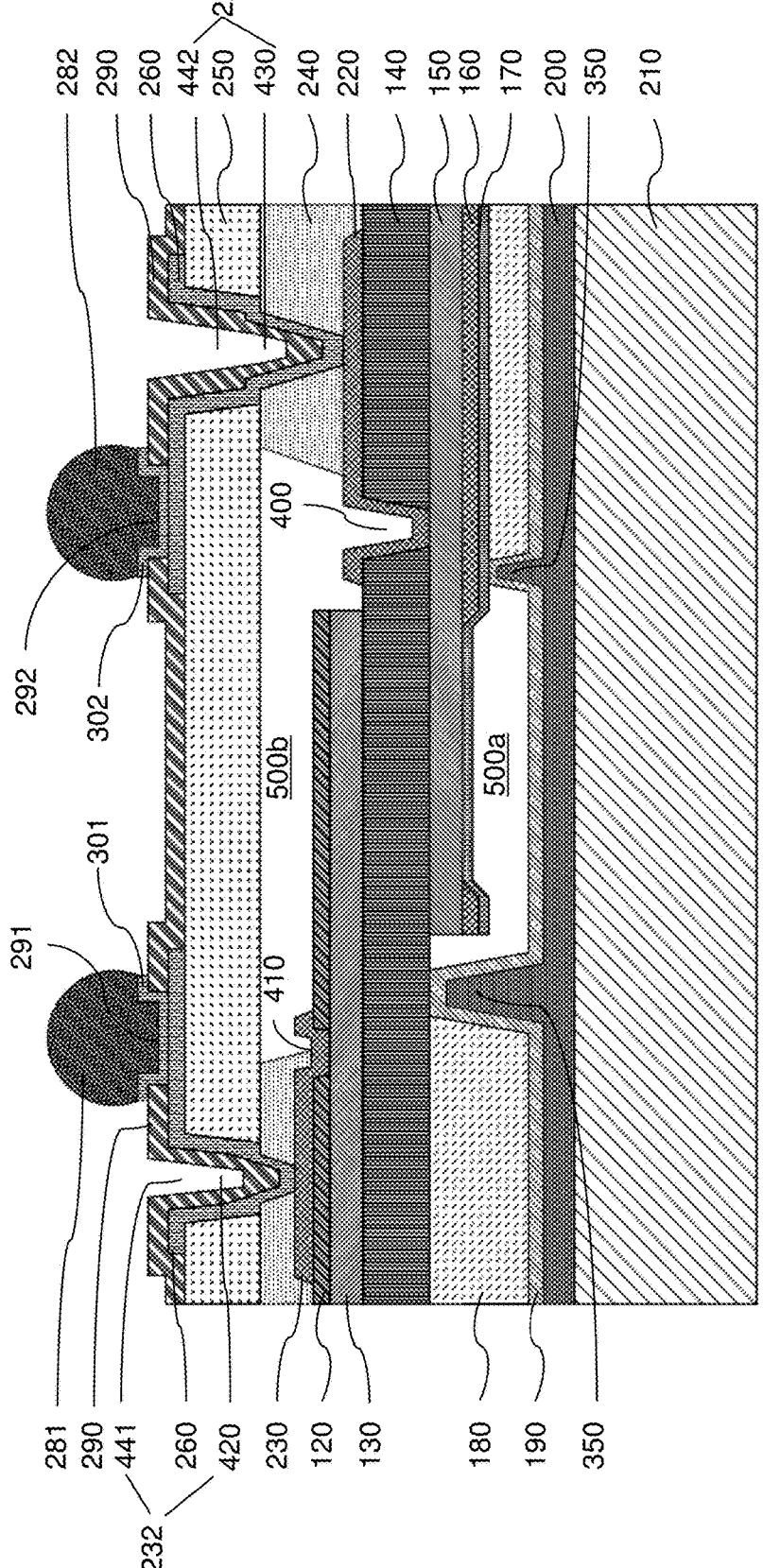

According to the above-described embodiments, solder bumps 281 and 282 are formed directly on top and bottom electrode through holes 232 and 222. In an alternative embodiment illustrated in FIG. 25, solder bumps 281 and 282 may be formed after an RDL process. For example, as illustrated in FIG. 25, conductive layer 260 is an RDL metal layer. Passivation layer 290 is formed on the structure illustrated in FIG. 19. Passivation layer 290 functions to protect conductive layer 260. First and second contact windows 291 and 292 are formed in passivation layer 290, respectively exposing the first and second sections of conductive layer 260. A metal layer is formed on passivation layer 290, and is patterned to form first and second under bump metal (UBM) layers 301 and 302. First UBM layer 301 is disposed on sidewalls of first contact window 291, and on the surface of passivation layer 290 near first contact window 291. Second UBM layer 302 is disposed on sidewalls of second contact window 292, and on the surface of passivation layer 290 near second contact window 292. Afterwards, first and second solder bumps 281 and 282 are disposed above first and second UBM layers 301 and 302, respectively. As a result, FBAR structure 1300 illustrated in FIG. 1D is fabricated.

FIG. 26 is a flow chart of a method 2600 of fabricating a FBAR structure, such as FBAR structure 1000, according to an embodiment of the present disclosure.

In step 2601, top electrode material layer 130, piezoelectric layer 140, and bottom electrode material layer 150 are sequentially formed on substrate 100, as illustrated in FIG. 3.

In step 2602, bottom electrode material layer 150 is patterned to form bottom electrode 150, as illustrated in FIG. 6.

In step 2603, sacrificial layer 180 is formed above bottom electrode 150, as illustrated in FIG. 7.

In step 2604, bottom cap wafer 210 is bonded onto sacrificial layer 180, as illustrated in FIG. 10.

In step 2605, substrate 100 is removed, as illustrated in FIG. 11.

In step 2606, top electrode material layer 130 is patterned to form top electrode 130, as illustrated in FIG. 12.

In step 2607, a portion of sacrificial layer 180 is removed to form lower cavity 500a, as illustrated in FIG. 15.

FBAR structures 1000, 1100, 1200, and 1300 in the embodiments of the present disclosure provide the following advantages.

First, FBAR structures 1000, 1100, 1200, and 1300 are fabricated using a double-sided manufacturing process. As a result, top and bottom electrodes 130 and 150 of FBAR structures 1000, 1100, 1200, and 1300 can be accurately patterned, which can minimize the parasitic capacitance and improve the quality (Q) factor of the FBAR.

Figure 27:
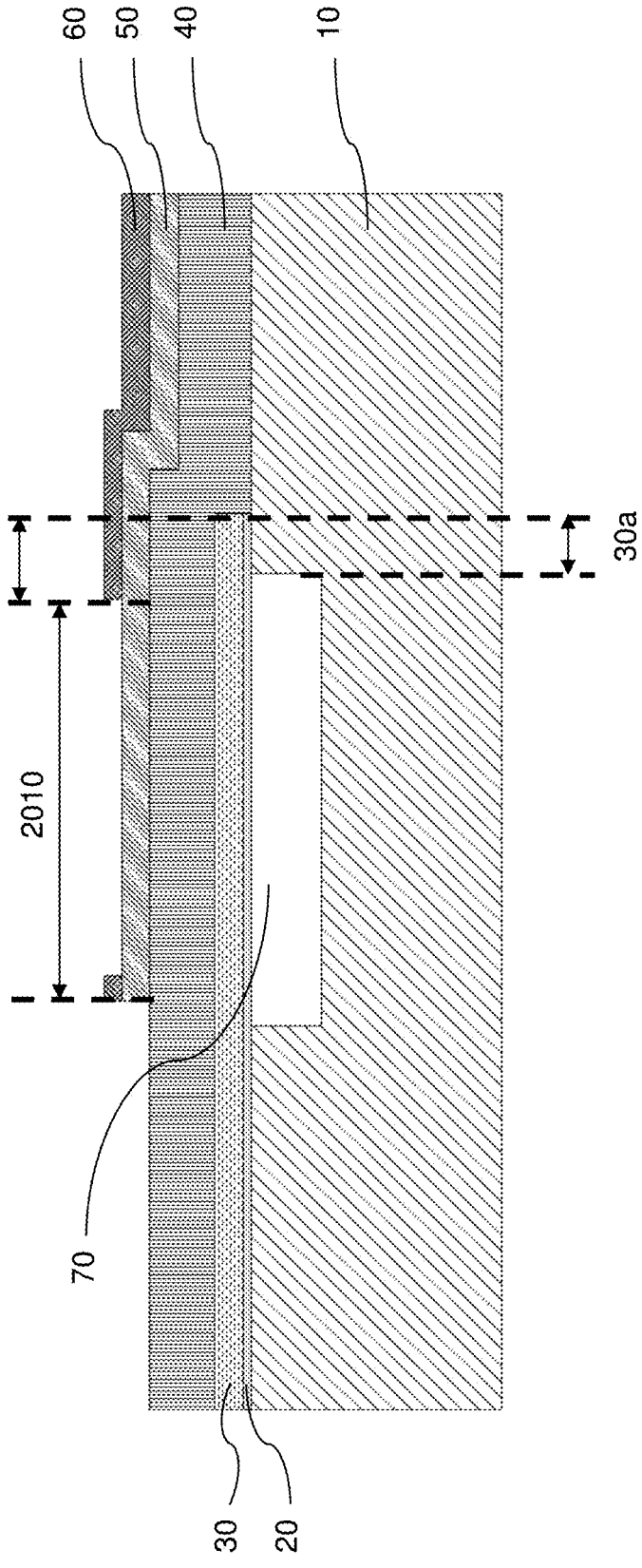
FIG. 27 is a cross-sectional view of a FBAR structure, according to a comparative example.

FIG. 27 is a cross-sectional view of a FBAR structure 2000 according to a comparative example. In order to fabricate FBAR structure 2000, a lower cavity 70 is formed in a substrate 10. Then, a passivation layer 20 and a bottom electrode 30 are formed on substrate 10. Here, because passivation layer 20 and bottom electrode 30 are patterned after lower cavity 70 is formed, it is necessary for passivation layer 20 and bottom electrode 30 to be formed covering an entirety of lower cavity 70, and both end portions of passivation layer 20 and bottom electrode 30 need to extend in a certain length on substrate 10 outside of lower cavity 70. For example, as illustrated in FIG. 27, portion 30a of bottom electrode 30 is formed on substrate 10 and extends to the outside of lower cavity 70. Afterward forming passivation layer 20 and bottom electrode 30, a piezoelectric layer 40, a top electrode 50, and a frame metal layer 60 is formed. As a result, FBAR structure 2000 is fabricated. In FBAR structure 2000, the overlapping portions of top electrode 50, piezoelectric layer 40, and bottom electrode 30 that are formed on lower cavity 70 constitute an effective working region 2010 for the FBAR. Outside of effective working region 2010, the overlapping portions of top electrode 50, piezoelectric layer 40, and bottom electrode 30 form a parasitic capacitor, which may undesirably pull down the Q value of the FBAR.

Figure 28:
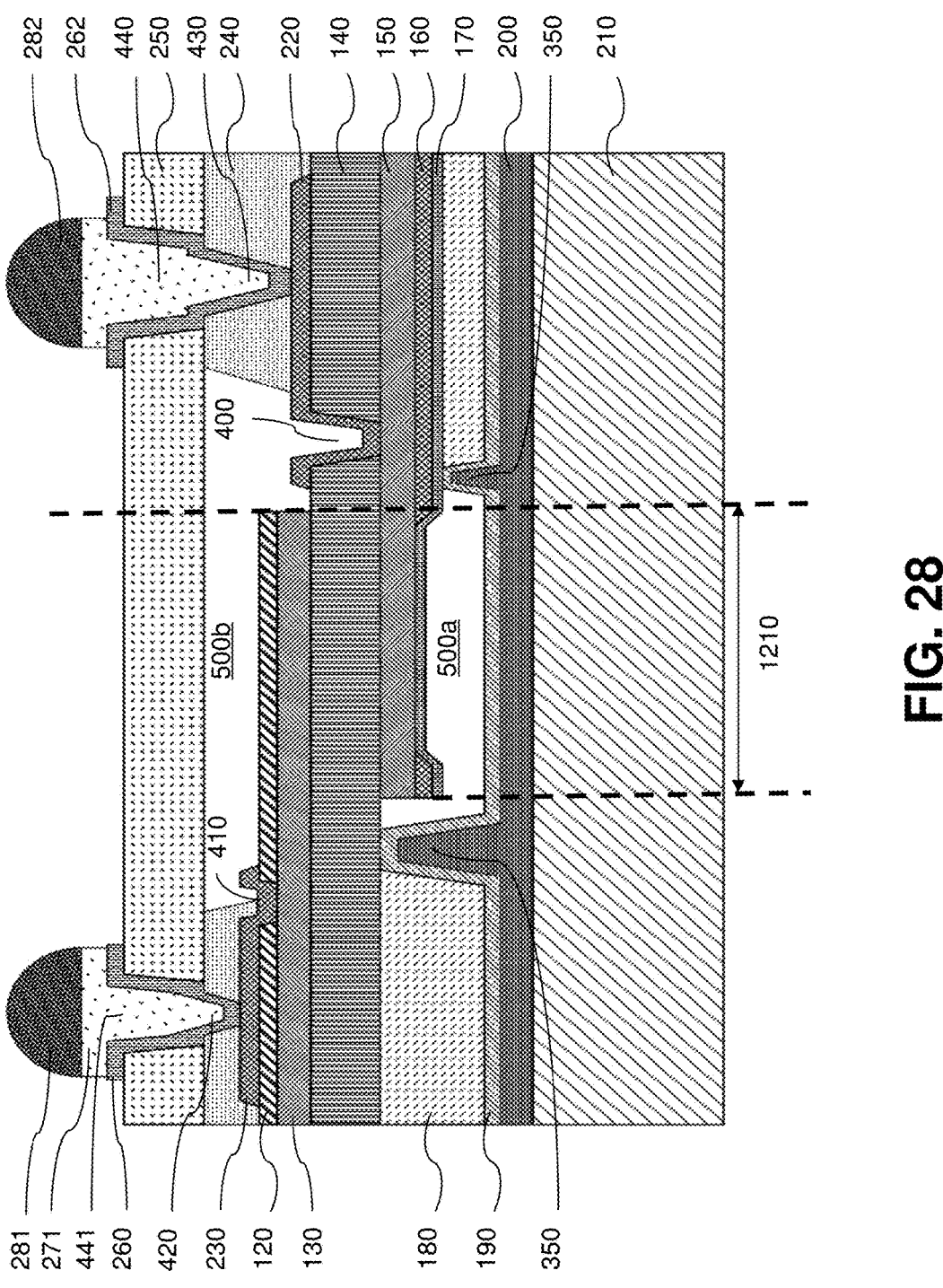
FIG. 28 is a cross-sectional view of a FBAR structure, according to an embodiment of the present disclosure.

On the other hand, as shown in FIG. 28, which is a cross-sectional view of FBAR structure 1200 according to an embodiment of the present disclosure, top electrode 130 and bottom electrode 150 are patterned after lower cavity 500a is formed. Therefore, the patterning of top electrode 130 and bottom electrode 150 may be precisely controlled. For example, an effective working region 1210 for FBAR structure 1200 is defined by overlapping regions of top electrode 130 and bottom electrode 150. As illustrated in FIG. 28, because the patterning of top electrode 130 and bottom electrode 150 may be precisely controlled, vertical projections of the edges of top electrode 130 and bottom electrode 150 may be located inside lower cavity 500a. Therefore, a vertical projection of the overlapping portion of top electrode 130 and bottom electrode 150 is confined in lower cavity 500a. As a result, parasitic capacitance resulted from overlapping portions of top and bottom electrodes 130 and 150 outside of lower cavity 500a may be minimized.

Another advantage provided by FBAR structures 1000, 1100, 1200, and 1300 according to the embodiments of the present disclosure is that, because solder bumps 281 and 282 are formed directly in or above top and bottom electrode through holes 232 and 222, there is no need for cumbersome RDL layers and processes, and the manufacturing cost is low. At the same time, because solder bumps 281 and 282 (in FIG. 20), or metal fillings 271 and 272 and solder bumps 281 and 282 (in FIG. 21), are rooted in top and bottom electrode through holes 232 and 222 defined by the low-deformation top cap wafer 250, the entire solder bump structure has higher reliability and can better adapt to the harsh processing environment of the subsequent PCB board-level packaging process, and to harsh product use conditions. Additionally, because the entire top and bottom electrode through holes 232 and 222 are filled with metal which has a higher thermal conductivity, top and bottom electrode through holes 232 and 222 has a better thermal conductivity, which is benefi-cial to improve power handling capability of a FBAR device.

Moreover, bottom cap wafer 210 of FBAR structures 1000, 1100, 1200, and 1300 formed by bonding a cap wafer via bottom bonding layer 200, bottom cap wafer 210 may be flexibly made of various materials. When bottom cap wafer 210 is made of a fully insulating material such as glass ($SiO_2$) and sapphire ($Al_2O_3$) and bottom bonding layer 200 is made of glass ($SiO_2$), there may be no parasitic conductive channel in an interface between bottom cap wafer 210 and bottom bonding layer 200. As a result, the performance of a filter composed of multiple such FBAR resonators is superior compared to a filter when silicon (Si) (even high resistivity silicon) used as bottom cap wafer 210.

Figure 29:
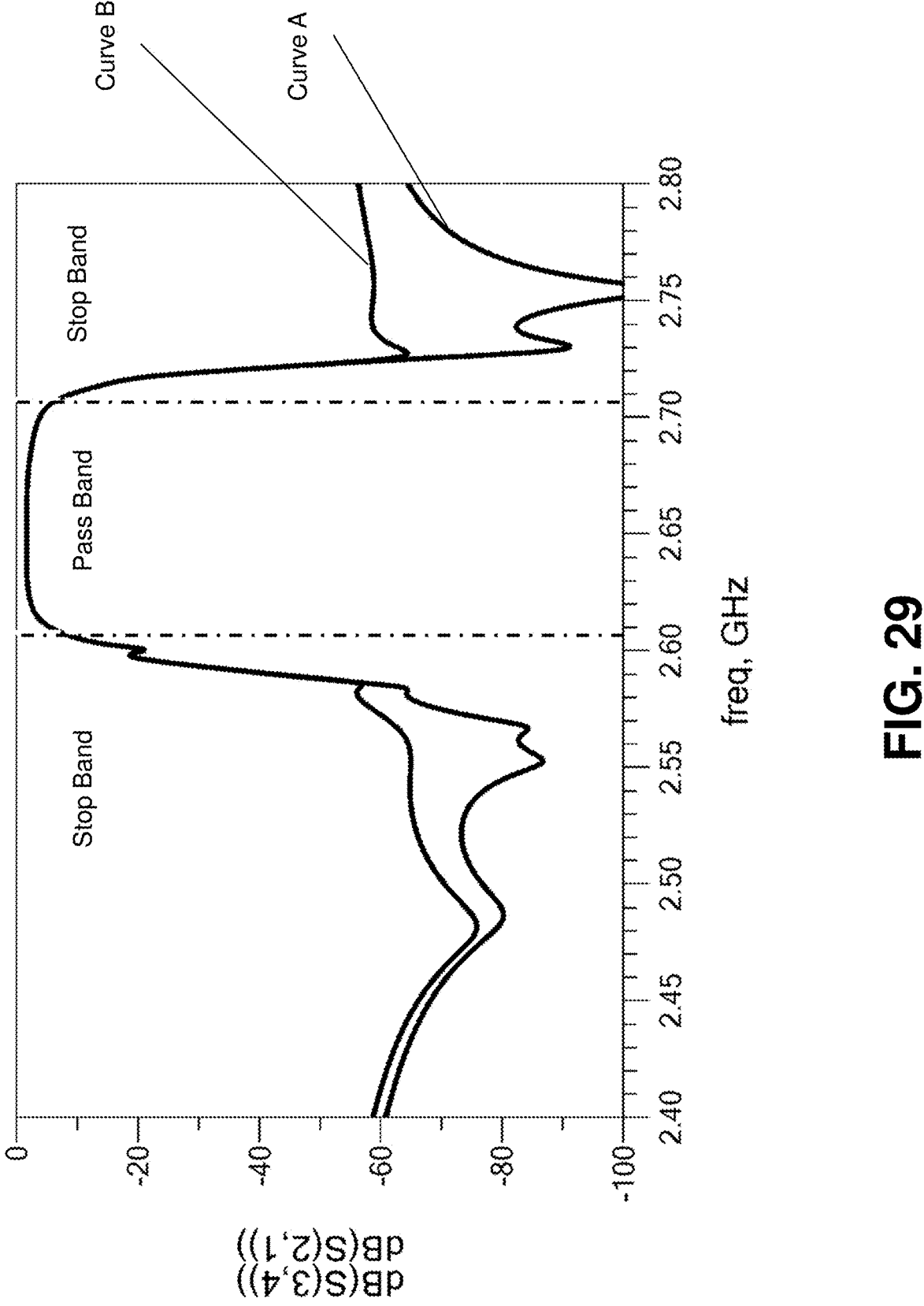
FIG. 29 is a graph showing frequency response curves of a FBAR filter according to an embodiment of the present disclosure and a FBAR filter according to a comparative example.

FIG. 29 is a graph showing a frequency response curve A of a FBAR filter formed with a bottom cap wafer made of glass according to an embodiment of the present disclosure, and a frequency response curve B of a FBAR filter formed with a bottom cap wafer made of silicon according to a comparative embodiment. According to FIG. 29, the out band rejection of curve A is significantly better than curve B. Therefore, the performance of the FBAR filter formed with the glass bottom cap wafer is better than that of the FBAR filter formed with the silicon bottom cap wafer.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A bulk acoustic wave resonator structure, comprising:
a bottom cap wafer;
a piezoelectric layer disposed on the bottom cap wafer;
a bottom electrode disposed below the piezoelectric layer;
a top electrode disposed above the piezoelectric layer, wherein portions of the bottom electrode, the piezo-electric layer, and the top electrode that overlap with each other constitute a piezoelectric stack;
a sacrificial layer disposed between the bottom cap wafer and the piezoelectric layer;
a lower cavity disposed within the sacrificial layer and below the piezoelectric stack; and
a bottom bonding layer disposed between the sacrificial layer and the bottom cap wafer, the bottom bonding layer including a protruding structure integrally formed as a part of the bottom bonding layer and protruding towards the piezoelectric layer and surrounding the lower cavity, and an entire bottom surface of the bottom bonding layer facing the bottom cap wafer being pla-narized,
wherein a projection of the piezoelectric stack is located within the lower cavity,
the protruding structure of the bottom bonding layer includes a first side surface facing the lower cavity and a second side surface facing away from the lower cavity,
the bulk acoustic wave resonator structure further includes a boundary layer continuously disposed between the bottom bonding layer and the piezoelectric layer and overlaying the protruding structure of the bottom bonding layer, the boundary layer being dis-posed between the first side surface of the protruding structure and the lower cavity, and between the second side surface of the protruding structure and the sacri-ficial layer,
the continuous boundary layer is continuously overlaying an entire upper surface of the bottom bonding layer including the protruding structure, and
the boundary layer includes a first portion disposed between the protruding structure of the bottom bonding layer and the piezoelectric layer, and a second portion disposed between the protruding structure of the bot-tom bonding layer and the bottom electrode.

2. The bulk acoustic wave resonator structure of claim 1, further comprising a raised structure disposed along an edge of the bottom electrode, the raised structure protruding from the bottom electrode towards the lower cavity.

3. The bulk acoustic wave resonator structure of claim 1, wherein the bottom cap wafer is bonded to the bottom bonding layer.

4. The bulk acoustic wave resonator structure of claim 1, further comprising:

a top passivation layer disposed above the top electrode; and a bottom passivation layer disposed below the bottom electrode.

5. The bulk acoustic wave resonator structure of claim 4, further comprising:

a bottom electrode contact layer disposed above the piezoelectric layer and electrically connected with the bottom electrode via a bottom electrode contact window formed in the piezoelectric layer; and a top electrode contact layer disposed above the top passivation layer and electrically connected with the top electrode via a top electrode contact window formed in the top passivation layer.

6. The bulk acoustic wave resonator structure of claim 5, further comprising:

an upper cavity disposed above the piezoelectric stack;

a top bonding layer disposed on the piezoelectric layer, and surrounding the upper cavity; and a top cap wafer bonded to the top bonding layer and covering the upper cavity.

7. The bulk acoustic wave resonator structure of claim 6, further comprising:

a bottom electrode through hole extending through the top bonding layer and the top cap wafer, and exposing a portion of the bottom electrode contact layer; and a top electrode through hole extending through the top bonding layer and the top cap wafer, and exposing a portion of the top electrode contact layer.

8. The bulk acoustic wave resonator structure of claim 7, further comprising:

a conductive layer;

a first section of the conductive layer being disposed on sidewalls of the top electrode through hole and the exposed portion of the top electrode contact layer; and a second section of the conductive layer being disposed on sidewalls of the bottom electrode through hole and the exposed portion of the bottom electrode contact layer.

9. The bulk acoustic wave resonator structure of claim 8, further comprising:

a first solder bump filled in the top electrode through hole and electrically connected with the first section of the conductive layer; and a second solder bump filled in the bottom electrode through hole and electrically connected with the second section of the conductive layer.

10. The bulk acoustic wave resonator structure of claim 8, further comprising:

a first metal filling filled in the bottom electrode through hole;

a first solder bump disposed on the first metal filling;

a second metal filling filled in the top electrode through hole; and a second solder bump disposed on the second metal filling.

11. The bulk acoustic wave resonator structure of claim 8, wherein the conductive layer is a redistribution layer, and the bulk acoustic wave resonator structure further comprises:

a first passivation layer disposed above the conductive layer, the first passivation layer including a first contact window and a second contact window;

a first solder bump disposed on the first passivation layer and electrically connected with the first section of the conductive layer via the first contact window; and a second solder bump disposed on the first passivation layer and electrically connected with the second section of the conductive layer via the second contact window.

12. The bulk acoustic wave resonator structure of claim 11, wherein the first contact window is not vertically aligned with the top electrode through hole, and the second contact window is not vertically aligned with the bottom electrode through hole.

13. The bulk acoustic wave resonator structure of claim 1, wherein the bottom cap wafer comprises glass or sapphire.

14. The bulk acoustic wave resonator structure of claim 1, wherein a projection of an edge of the top electrode is located within the lower cavity.

15. The bulk acoustic wave resonator structure of claim 1, wherein a projection of an edge of the bottom electrode is located within the lower cavity.

16. The bulk acoustic wave resonator structure of claim 1, further comprising a raised structure disposed along an edge of the top electrode, the raised structure protruding from the top electrode in a direction away from the bottom electrode.

17. The bulk acoustic wave resonator structure of claim 1, wherein the piezoelectric layer includes aluminum nitride (AlN), zinc oxide (ZnO), lithium niobate (LiNbO$_3$), lithium tantalate (LiTaO$_3$), lead zirconate titanate (PZT), barium strontium titanate (BST), or a stacked combination of two or more of these materials.

18. The bulk acoustic wave resonator structure of claim 1, wherein the top electrode and the bottom electrode include molybdenum (Mo), aluminum (Al), copper (Cu), platinum (Pt), tantalum (Ta), tungsten (W), palladium (Pd), ruthenium (Ru), or a stacked combination of two or more of these materials.

\* \* \* \* \*